US010177767B2

(12) United States Patent
Kozuma

(10) Patent No.: US 10,177,767 B2
(45) Date of Patent: Jan. 8, 2019

(54) SEMICONDUCTOR DEVICE, ELECTRONIC COMPONENT, AND ELECTRONIC DEVICE

(71) Applicant: Semiconductor Energy Laboratory Co., Ltd., Atsugi-shi, Kanagawa-ken (JP)

(72) Inventor: Munehiro Kozuma, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/345,761

(22) Filed: Nov. 8, 2016

(65) Prior Publication Data

US 2017/0141776 A1    May 18, 2017

(30) Foreign Application Priority Data

Nov. 13, 2015 (JP) .................................. 2015-222635

(51) Int. Cl.
*H03K 19/0175* (2006.01)
*H03K 19/177* (2006.01)

(52) U.S. Cl.
CPC ... *H03K 19/17764* (2013.01); *H03K 19/1774* (2013.01); *H03K 19/1776* (2013.01); *H03K 19/17728* (2013.01); *H03K 19/17792* (2013.01)

(58) Field of Classification Search
CPC ......... H03K 19/17728; H03K 19/1774; H03K 19/1776; H03K 19/17764; H03K 19/17792
See application file for complete search history.

(56) References Cited

U.S. PATENT DOCUMENTS

| 5,303,350 A | 4/1994 | Yu et al. | |
|---|---|---|---|
| 6,031,391 A * | 2/2000 | Couts-Martin | ........ G11C 29/48 326/38 |
| 6,172,521 B1 | 1/2001 | Motomura | |

(Continued)

FOREIGN PATENT DOCUMENTS

| DE | 102013207217 | 10/2013 |
|---|---|---|
| JP | 10-285014 A | 10/1998 |

(Continued)

OTHER PUBLICATIONS

Waidyasooriya.H et al., "Implementation of a Partially Reconfigurable Multi-Context FPGA Based on Asynchronous Architecture", IEICE Trans. Electron. (IEICE Transactions on Electronics), Apr. 1, 2009, vol. E92-C, No. 4, pp. 539-549.

(Continued)

*Primary Examiner* — Alexander H Taningco
*Assistant Examiner* — Kurtis R Bahr
(74) *Attorney, Agent, or Firm* — Fish & Richardson P.C.

(57) ABSTRACT

A semiconductor device includes a configuration memory that has functions of holding configuration data and generating a signal based on the configuration data, a context generator that has a function of generating a signal for controlling context switch, a clock generator that has a function of operating in a first mode or a second mode in accordance with the signal generated in the configuration memory, and a PLD. A clock signal is input to the context generator and the clock generator. The clock generator outputs the clock signal to the PLD in the first mode and stops outputting the clock signal to the PLD in the second mode.

17 Claims, 15 Drawing Sheets

(56) References Cited

U.S. PATENT DOCUMENTS

| | | | |
|---|---|---|---|
| 6,496,918 B1* | 12/2002 | DeHon | G06F 15/8023 712/15 |
| 7,461,242 B2* | 12/2008 | Grossman | G06F 9/461 712/228 |
| 7,761,755 B1* | 7/2010 | Payakapan | G01R 31/31922 713/500 |
| 8,001,549 B2* | 8/2011 | Henmi | G06F 9/4843 718/108 |
| 8,207,756 B2 | 6/2012 | Shionoiri et al. | |
| 8,542,034 B2 | 9/2013 | Kato | |
| 8,547,753 B2 | 10/2013 | Takemura et al. | |
| 8,952,722 B2* | 2/2015 | Ikeda | H03K 19/17772 326/38 |
| 8,952,723 B2 | 2/2015 | Aoki et al. | |
| 8,970,251 B2 | 3/2015 | Kurokawa | |
| 8,970,253 B2* | 3/2015 | Kurokawa | H03K 19/0013 326/38 |
| 9,385,720 B2 | 7/2016 | Okamoto et al. | |
| 9,558,000 B2* | 1/2017 | Glossner | G06F 9/3851 |
| 9,564,905 B2* | 2/2017 | Chalasani | H03K 19/0175 |
| 2008/0024307 A1* | 1/2008 | Wissendheit | H01Q 1/22 340/572.7 |
| 2011/0101351 A1 | 5/2011 | Yamazaki | |
| 2011/0227605 A1* | 9/2011 | Watanabe | H03K 19/00 326/38 |
| 2012/0293200 A1 | 11/2012 | Takemura | |
| 2013/0147518 A1 | 6/2013 | Shionoiri et al. | |
| 2013/0285697 A1 | 10/2013 | Kurokawa | |
| 2013/0314124 A1 | 11/2013 | Ikeda et al. | |
| 2013/0321025 A1 | 12/2013 | Kurokawa et al. | |
| 2014/0159771 A1* | 6/2014 | Ikeda | H03K 19/0016 326/41 |
| 2014/0176185 A1* | 6/2014 | Kurokawa | H03K 19/173 326/38 |
| 2014/0225644 A1* | 8/2014 | Aoki | H03K 19/1776 326/41 |
| 2014/0368235 A1* | 12/2014 | Aoki | H03K 19/01858 326/38 |
| 2015/0008958 A1* | 1/2015 | Kurokawa | H03K 19/01852 326/41 |
| 2015/0145559 A1* | 5/2015 | Kozuma | H03K 19/1776 326/38 |
| 2015/0256182 A1* | 9/2015 | Okamoto | H03K 19/1776 326/38 |
| 2016/0086958 A1* | 3/2016 | Kozuma | H01L 29/7869 257/43 |
| 2017/0090536 A1* | 3/2017 | Schreiner | G06F 1/08 |

FOREIGN PATENT DOCUMENTS

| | | |
|---|---|---|
| JP | 2013-243657 A | 12/2013 |
| JP | 2014-068132 A | 4/2014 |

OTHER PUBLICATIONS

International Search Report (Application No. PCT/IB016/056671) dated Feb. 7, 2017.

Written Opinion (Application No. PCT/IB2016/056671) dated Feb. 7, 2017.

* cited by examiner

SEMICONDUCTOR DEVICE, ELECTRONIC COMPONENT, AND ELECTRONIC DEVICE

TECHNICAL FIELD

One embodiment of the present invention relates to a semiconductor device.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Specific examples of the technical field of one embodiment of the present invention disclosed in this specification and the like include a semiconductor device, a display device, a liquid crystal display device, a light-emitting device, a lighting device, a power storage device, a memory device, an imaging device, a method for operating any of them, and a method for manufacturing any of them.

In this specification and the like, a semiconductor device generally means a device that can function by utilizing semiconductor characteristics. A transistor and a semiconductor circuit are embodiments of semiconductor devices. In some cases, a memory device, a display device, an imaging device, or an electronic device includes a semiconductor device.

BACKGROUND ART

A programmable logic device (PLD) includes a plurality of programmable logic elements (PLEs) and a plurality of programmable switch elements (PSEs). In the PLD, data on a function of each PLE and data on connections between the PLEs by PSEs are stored as configuration data in a configuration memory. In other words, the PLD stores its circuit configuration as configuration data.

A multi-context reconfigurable device is suggested (e.g., Non-Patent Document 1). In the multi-context reconfigurable device, the circuit configuration of a PLD is changed by storing a plurality of sets of configuration data in the PLD and changing configuration data to be used. Configuration data representing a circuit configuration is referred to as context. Furthermore, switching of the circuit configuration of a PLD is referred to as context switch.

REFERENCE

Non-Patent Document

[Non-Patent Document 1] H. M. Waidyasooriya et al., "Implementation of a Partially Reconfigurable Multi-Context FPGA Based on Asynchronous Architecture," IEICE TRANSACTIONS on Electronics, Vol. E92-C, pp. 539-549, 2009

DISCLOSURE OF INVENTION

Since one clock cycle with respect to time required for context switch becomes shorter as a clock frequency becomes higher, context switch is not completed in one clock period. In that case, the output data of a flip-flop included in a PLD is processed during the context switch, or with incomplete a circuit configuration that is not included in a configuration data set. As a result, data not intended by a user is generated, in which case data transfer between before and after context switch cannot be performed normally. Furthermore, in the case of an incomplete circuit in which a high-potential output signal and a low-potential output signal are supplied to the same node, shoot-through current might be generated, which leads to an increase in power consumption.

Thus, an object of one embodiment of the present invention is to provide a semiconductor device in which data transfer between before and after context switch can be performed normally even at a high clock frequency. Another object is to provide a semiconductor device in which generation of shoot-through current can be suppressed.

Another object of one embodiment of the present invention is to provide a semiconductor device that is suitable for high-speed operation. Another object is to provide a highly reliable semiconductor device. Another object is to provide a semiconductor device with reduced power consumption. Another object is to provide a semiconductor device including a transistor with a low off-state current. Another object is to provide a semiconductor device that can be used in a wide temperature range.

Another object of one embodiment of the present invention is to provide a novel semiconductor device, a novel electronic device, and the like.

Note that the objects of one embodiment of the present invention are not limited to the above objects. The objects described above do not preclude the existence of other objects. The other objects are the ones that are not described above and will be described below. The other objects will be apparent from and can be derived from the description of the specification, the drawings, and the like by those skilled in the art. One embodiment of the present invention solves at least one of the above objects and the other objects.

One embodiment of the present invention is a semiconductor device including a configuration memory, a first circuit, a second circuit, and a third circuit. The configuration memory is configured to retain configuration data. The configuration memory is configured to generate a first signal corresponding to the configuration data. A second signal is input to the first circuit and the second circuit. The first circuit is configured to generate a third signal and a fourth signal and output the third signal and the fourth signal to the configuration memory and the third circuit. The second circuit is configured to operate in a first mode or a second mode in accordance with the first signal. The second circuit outputs a fifth signal to the third circuit in the first mode and stops outputting the fifth signal to the third circuit in the second mode. The third circuit serves as a programmable logic circuit. The second signal serves as a clock signal that determines operation timing of the first circuit and the second circuit. The third signal and the fourth signal serve as signals for context switch. The fifth signal serves as a clock signal that determines operation timing of the third circuit.

The second circuit may be configured to perform switching from the first mode to the second mode after one of a potential of the third signal and a potential of the fourth signal starts to be changed from a low potential to a high potential and then to stop outputting the fifth signal for one clock to perform switching from the second mode to the first mode.

One embodiment of the present invention is a semiconductor device including first to m-th configuration memories, where m is an integer of 2 or more, a first circuit, a second circuit, and a third circuit. The first to m-th configuration memories are each configured to retain configuration data. The first to m-th configuration memories are configured to generate first to m-th digital signals each of which corresponds to the configuration data retained in a corresponding configuration memory. A first signal is input to the first circuit and the second circuit. The first circuit is configured to generate a second signal and a third signal and output the second signal and the third signal to the first to m-th configuration memories and the third circuit. The second circuit is configured to operate in a first mode or a second mode in accordance with the first to m-th digital signals. The second circuit outputs a fourth signal to the third circuit in the first mode and stops outputting the fourth signal to the third circuit in the second mode. The third circuit serves as a programmable logic circuit. The first signal serves as a clock signal that determines operation timing of the first circuit and the second circuit. The second signal and the third signal serve as signals for context switch. The fourth signal serves as a clock signal that determines operation timing of the third circuit.

The second circuit may be configured to generate binary integer data from the first to m-th digital signals in the second mode. The second circuit may be configured to perform switching from the first mode to the second mode after one of a potential of the second signal and a potential of the third signal starts to be changed from a low potential to a high potential and to perform switching from the second mode to the first mode after stopping outputting the fourth signal for clocks whose number is the integer.

The second circuit may be configured to perform switching to the second mode when a potential of one of the first to m-th digital signals becomes high.

Another embodiment of the present invention is an electronic component including the semiconductor device of one embodiment of the present invention and a lead electrically connected to the semiconductor device.

Another embodiment of the present invention is an electronic device including the electronic component of one embodiment of the present invention and at least one of a display device, a touch panel, a microphone, a speaker, an operation key, and a housing.

One embodiment of the present invention can provide a semiconductor device in which data transfer between before and after context switch can be performed normally even at a high clock frequency, or a semiconductor device in which generation of shoot-through current can be suppressed.

One embodiment of the present invention can provide a semiconductor device that is suitable for high-speed operation, a highly reliable semiconductor device, a semiconductor device with reduced power consumption, a semiconductor device including a transistor with a low off-state current, or a semiconductor device that can be used in a wide temperature range.

One embodiment of the present invention can provide a novel semiconductor device, a novel electronic device, and the like.

Note that the effects of one embodiment of the present invention are not limited to the above effects. The effects described above do not preclude the existence of other effects. The other effects are the ones that are not described above and will be described below. The other effects will be apparent from and can be derived from the description of the specification, the drawings, and the like by those skilled in the art. One embodiment of the present invention has at least one of the above effects and the other effects. Therefore, one embodiment of the present invention does not have the effects described above in some cases.

BEST MODE FOR CARRYING OUT THE INVENTION

Figure 1A:
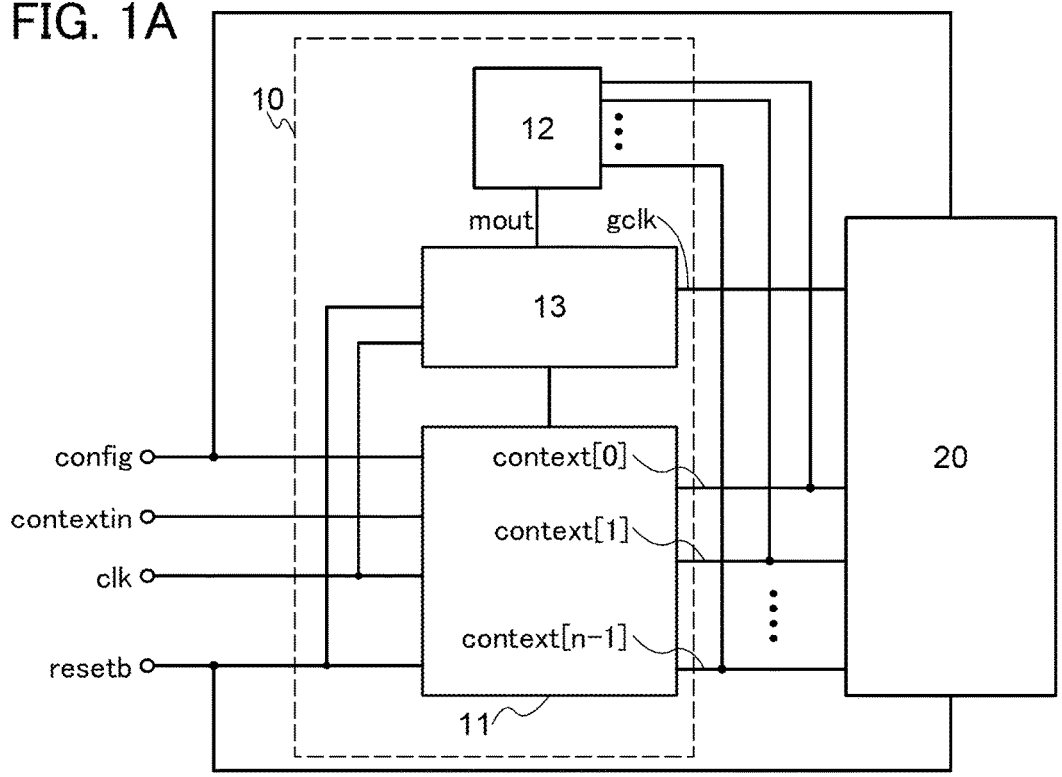
FIGS. 1A and 1B are block diagrams each illustrating a configuration example of a semiconductor device.

Embodiments will be described in detail with reference to the drawings. Note that the present invention is not limited to the following description, and it will be readily appreciated by those skilled in the art that modes and details can be modified in various ways without departing from the spirit and scope of the present invention. Therefore, the present invention should not be interpreted as being limited to the description of the embodiments below. Note that in structures of the present invention described below, the same portions or portions having similar functions are denoted by the same reference numerals in different drawings, and description thereof is not repeated in some cases. In some cases, the same components are denoted by different hatching patterns in different drawings, or the hatching patterns are omitted.

In this specification and the like, a transistor is an element having at least three terminals of a gate, a drain, and a source. The transistor has a channel region between a drain (a drain terminal, a drain region, or a drain electrode) and a source (a source terminal, a source region, or a source electrode), and current can flow through the drain, the channel region, and the source.

Here, since the source and the drain are interchangeable depending on a structure, operating conditions, or the like of the transistor, it is difficult to define which is a source or a drain. Thus, the terms "source" and "drain" can be interchanged with each other depending on the situation or circumstances.

In this specification and the like, an explicit description "X and Y are connected" means that X and Y are electrically connected, X and Y are functionally connected, and X and Y are directly connected. Accordingly, without being limited to a predetermined connection relation, for example, a connection relation shown in drawings or texts, another connection relation is regarded as being included in the drawings or the texts.

Here, X and Y each denote an object (e.g., a device, an element, a circuit, a wiring, an electrode, a terminal, a conductive film, or a layer).

Examples of the case where X and Y are directly connected include the case where an element that allows electrical connection between X and Y (e.g., a switch, a transistor, a capacitor, an inductor, a resistor, a diode, a display element, a light-emitting element, or a load) is not connected between X and Y, and the case where X and Y are connected without an element that allows electrical connection between X and Y provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. Note that a switch is controlled to be turned on or off. That is, the switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generator circuit; a memory circuit; and/or a control circuit) can be connected between X and Y. For instance, even if another circuit is provided between X and Y, X and Y are functionally connected when a signal output from X is transmitted to Y. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., X and Y are connected with another element or circuit provided therebetween), X and Y are functionally connected (i.e., X and Y are functionally connected with another element or circuit provided therebetween), and X and Y are directly connected (i.e., X and Y are connected without another element or circuit provided therebetween). That is, in this specification and the like, the term "electrically connected" is substantially the same as the term "connected."

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include "X, Y, and a source (or a first terminal or the like) and a drain (or a second terminal or the like) of a transistor are electrically connected to each other, and X, the source (or the first terminal or the like) of the transistor, the drain (or the second terminal or the like) of the transistor, and Y are electrically connected in this order," "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected in this order," and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order." When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path," and "a source (or a first terminal or the like) of a transistor is electrically connected to X through Z1 at least with a first connection path, the first connection path does not include a second connection path, the second connection path includes a connection path through the transistor, a drain (or a second terminal or the like) of the transistor is electrically connected to Y through Z2 at least with a third connection path, and the third connection path does not include the second connection path." Still another example of the expression is "a source (or a first terminal or the like) of a transistor is electrically connected to X through Z1 on at least a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through Z2 on at least a third electrical path, the third electrical path does not include a fourth electrical path, and the fourth electrical path is an electrical path from the drain (or the second terminal or the like) of the transistor to the source (or the first terminal or the like) of the transistor." When the connection path in a circuit configuration is defined by an expression similar to the above examples, a source (or a first terminal or the like) and a drain (or a second terminal or the like) of a transistor can be distinguished from each other to specify the technical scope.

Note that the above expressions are examples and there is no limitation on the expressions. Here, X, Y, Z1, and Z2 each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring functions as an electrode, one conductive film functions as the wiring and the electrode. Thus, "electrical connection" in this specification includes, in its category, such a case where one conductive film has functions of a plurality of components.

Note that in general, a potential (voltage) is a relative value and its level depends on the difference from a reference potential. Therefore, a ground potential, GND, or the like is not necessarily 0 V. For example, a ground potential or GND may be defined using the lowest potential or a substantially intermediate potential in a circuit as a reference. In those cases, a positive potential and a negative potential are set using the potential as a reference.

Embodiment 1

In this embodiment, a semiconductor device of one embodiment of the present invention will be described with reference to drawings.

One embodiment of the present invention relates to a semiconductor device including a controller and a PLD controlled by the controller. The controller has a function of supplying a clock signal to the PLD. The reconfiguration of the PLD, or the like, is performed on the basis of the clock signal. Note that when a clock signal is input to the PLD during the reconfiguration of the PLD, or the like, abnormal data might be captured by the PLD, for example, leading to malfunction of the semiconductor device of one embodiment of the present invention. The semiconductor device of one embodiment of the present invention performs clock gating so that a clock signal can be prevented from being input to the PLD during reconfiguration or the like. Accordingly, the semiconductor device of one embodiment of the present invention can operate normally and operate at high speed even at a high clock frequency.

<Semiconductor Device>

FIG. 1A is a block diagram illustrating a configuration example of the semiconductor device of one embodiment of the present invention. The semiconductor device includes a controller 10 and a PLD 20 controlled by the controller 10. The controller 10 includes a context generator 11, a configuration memory 12, and a clock generator 13. The PLD 20 includes, for example, PLEs, which are programmable logic circuits, and an input/output circuit that controls signal input and output between the PLE and an external terminal included in the semiconductor device of one embodiment of the present invention. The PLD 20 also includes, for example, PSEs that determine a connection relationship between the PLEs, a connection relationship between the input/output circuit and the PLEs, or the like. Note that the PLEs, the PSEs, and the like included in the PLD 20 each include a configuration memory.

The positional relations of circuit blocks in a block diagram are specified for description. Even when a diagram illustrates that different functions are achieved by different circuit blocks, one circuit block may be actually configured to achieve different functions. Furthermore, the functions of circuit blocks in a diagram are specified for description. Even when a diagram illustrates one circuit block performing processing, a plurality of circuit blocks may be actually provided to perform the processing.

A signal clk, a signal resetb, a signal config, and a signal contextin can be input to the context generator 11. The signal clk and the signal resetb can be input to the clock generator 13. The signal resetb and the signal config can be input to the PLD 20.

The signal clk serves as a clock signal that determines operation timing of each circuit included in the controller 10. The signal resetb serves as a reset signal for flip-flops of the circuits included in the semiconductor device of one embodiment of the present invention. The details will be described later. The signal config serves as a signal indicating a state of configuration operation. The signal contextin serves as a signal for setting a state of context.

The context generator 11 has functions of generating signals context[0] to context[n−1] (n is an integer of 2 or more) necessary for context switch and outputting the signals to the configuration memory 12 and the configuration memories included in the PLD 20. The context generator 11 also has a function of generating a variety of signals necessary for the operation of the clock generator 13. The details will be described later. The configuration memory 12 has functions of retaining configuration data and generating a signal mout corresponding to the retained configuration data.

The clock generator 13 has a function of controlling whether to output or stop outputting a signal gclk serving as a clock signal to the PLD 20 in accordance with the logic of a variety of signals, which are necessary for the operation of the clock generator 13 and are generated by the context generator 11, and the logic of the signal mout generated by the configuration memory 12. For example, clock gating for one clock can be performed after context switch starts in the case where the potential of the signal mout is at an H level, and no clock gating can be performed in the case where the potential of the signal mout is at an L level.

When the same reference numerals used in this specification need to be distinguished from one another, symbols for identification such as [0], [1], and [n] are added to the reference numerals in some cases. For example, symbols such as [0] and [n−1] are used to distinguish a plurality of signals context from one another.

In this specification, an H level potential and an L level potential refer to a high potential and a low potential, respectively. An L level potential can be, for example, a ground potential.

In the case where the potential of the signal resetb is at an H level, for example, reset states of the flip-flops of the circuits included in the semiconductor device of one embodiment of the present invention can be canceled to allow data setup depending on the logic of the signal clk or the signal gclk. In contrast, in the case where the potential of the signal resetb is at an L level, the flip-flops of the circuits included in the semiconductor device of one embodiment of the present invention can be made in reset states so that data setup cannot be performed. The signal config can have an H level potential while the configuration memory 12 performs configuration operation and an L level potential while the configuration memory 12 does not perform configuration operation, for example. Note that the logic of the signal mout, the signal resetb, and the signal config can be inverted as appropriate.

Figure 1B:
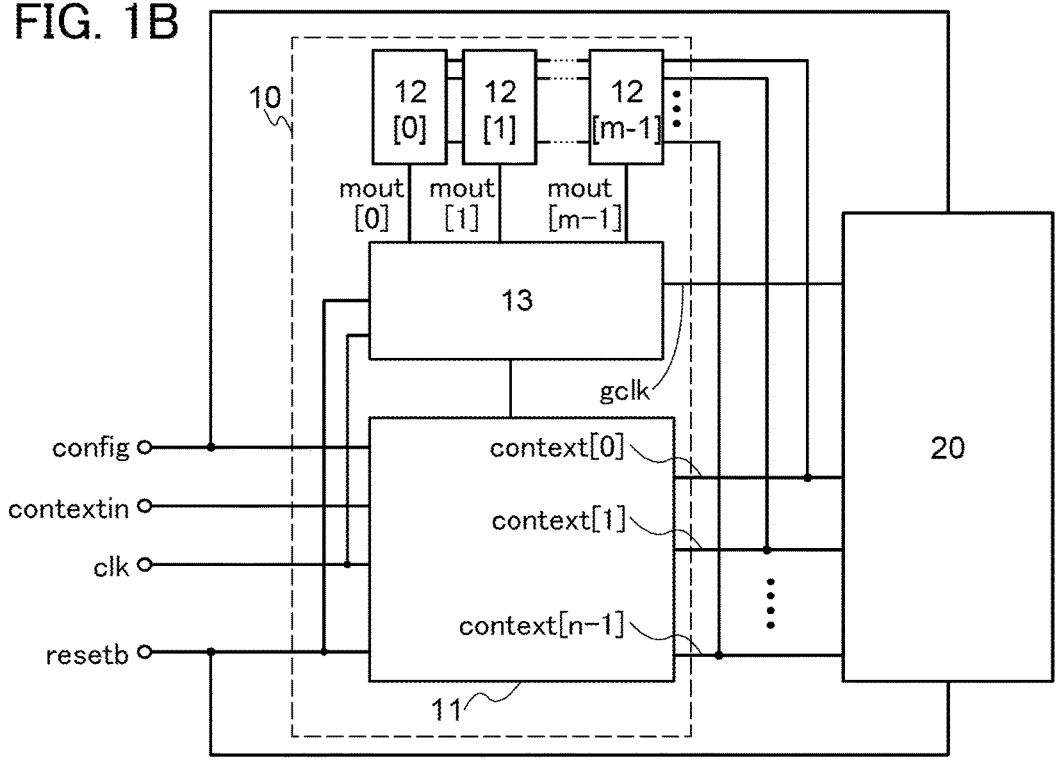

Although the controller 10 includes one configuration memory 12 in FIG. 1A, the controller 10 may include configuration memories 12[0] to 12[m−1] (m is an integer of 2 or more) as illustrated in FIG. 1B. In the case of the configuration illustrated in FIG. 1B, the configuration memories 12[0] to 12[m−1] have functions of generating signals mout[0] to mout[m−1], respectively. This means that the configuration memory 12 has a function of generating m-bit signals mout.

With the configuration illustrated in FIG. 1B, for example, the clock generator 13 can generate binary integer data on the basis of the logic of the signals mout[0] to mout[m−1], which enables clock gating to be performed on the PLD 20 for clocks whose number is the integer. The binary integer data can be generated to have the signal mout[0] as the least significant bit (LSB) and the signal mout[m−1] as the most significant bit (MSB), for example.

In the case where the potential of the signal mout[1] is at an H level and the potentials of the other signals mout are all at an L level, for example, the clock generator 13 can perform clock gating for two clocks. In the case where the potentials of the signals mout[0] and mout[1] are at an H level and the potentials of the other signals mout are all at an L level, for example, the clock generator 13 can perform clock gating for three clocks. In the case where the potential of the signal mout[m−1] is at an H level and the potentials of the other signals mout are all at an L level, for example, the clock generator 13 can perform clock gating for $2^{m-1}$ clocks. In the case where the potentials of the signals mout[0] to mout[m−1] are all at an H level, the clock generator 13 can perform clock gating for $2^m-1$ clocks.

In the case where the potentials of the signals mout[0] to mout[m−1] are all at an L level, for example, the clock generator 13 can perform no clock gating.

In the semiconductor device with the configuration illustrated in FIG. 1A or FIG. 1B, when clock gating is performed on the PLD 20 until context switch is completed, data transfer between before and after context switch can be performed in the PLD 20 even in high-speed clock operation. The details will be described later.

Figure 2A:
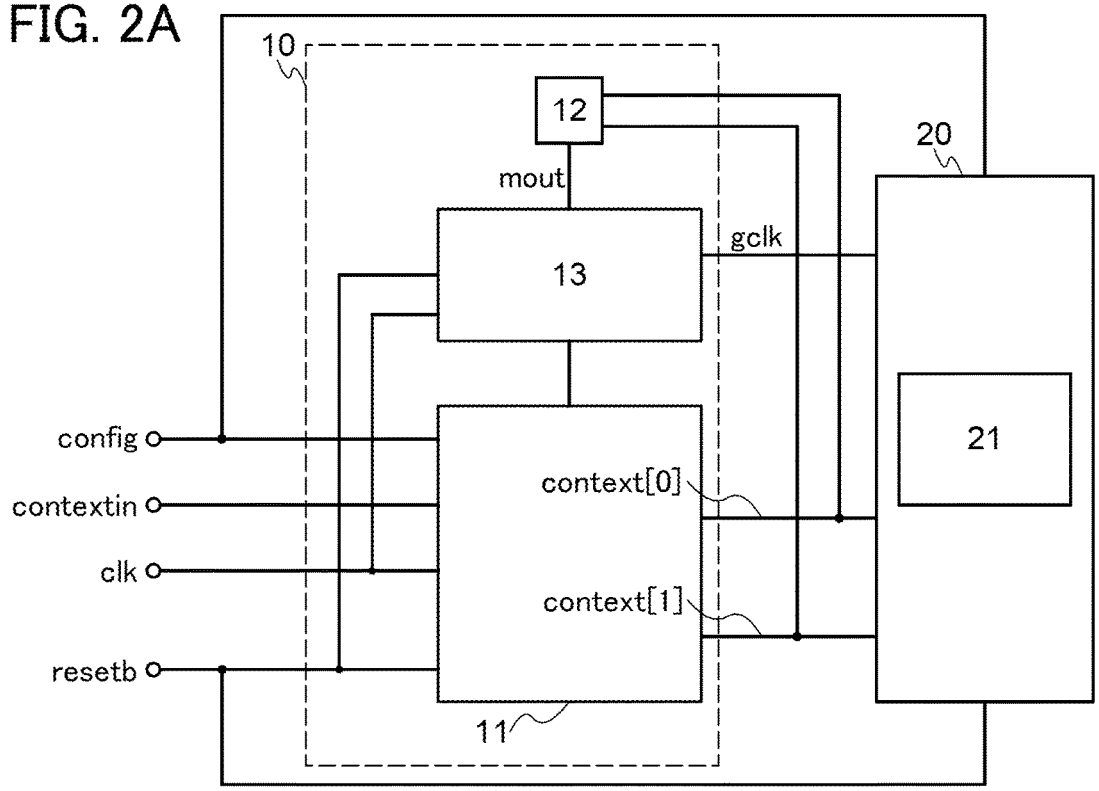
FIGS. 2A and 2B are block diagrams each illustrating a configuration example of a semiconductor device.
Figure 2B:
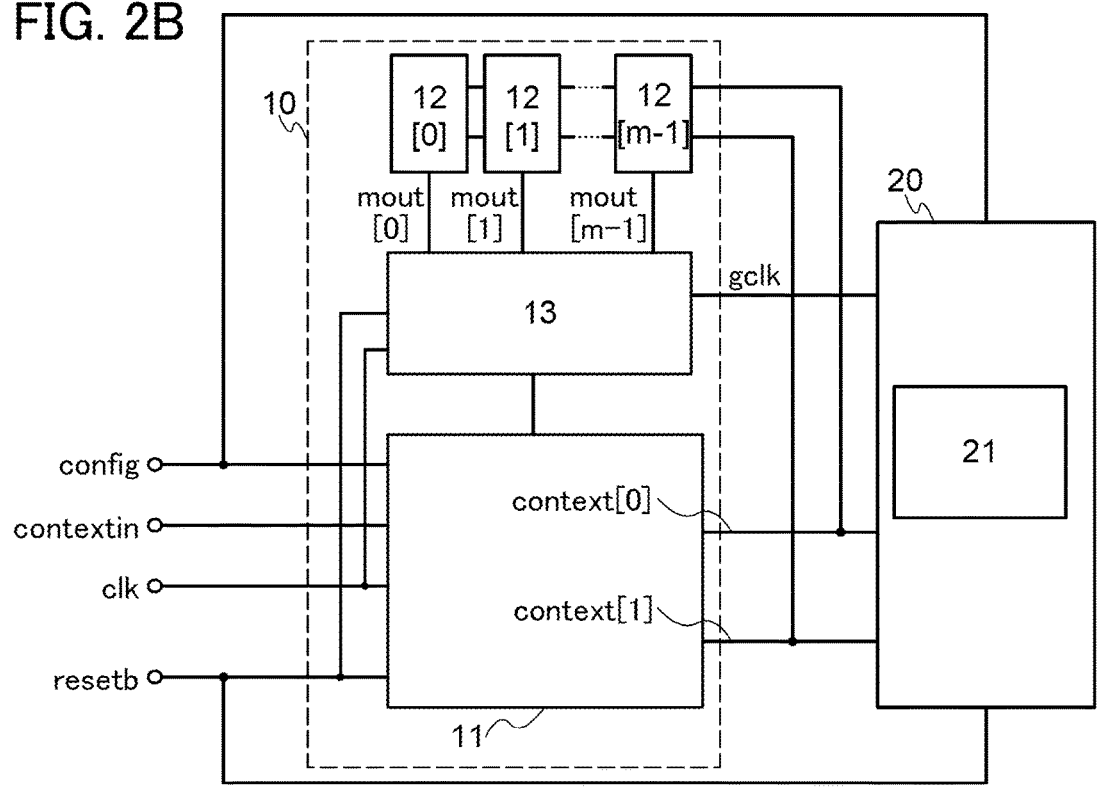

The semiconductor device of one embodiment of the present invention can have a configuration illustrated in FIG. 2A or FIG. 2B. FIGS. 2A and 2B are block diagrams of semiconductor devices which are the same as those in FIGS. 1A and 1B, respectively, except that the signals context generated by the context generator 11 are the signals context[0] and context[1] and the PLD 20 includes a PLE 21.

<Controller>

Figure 3:
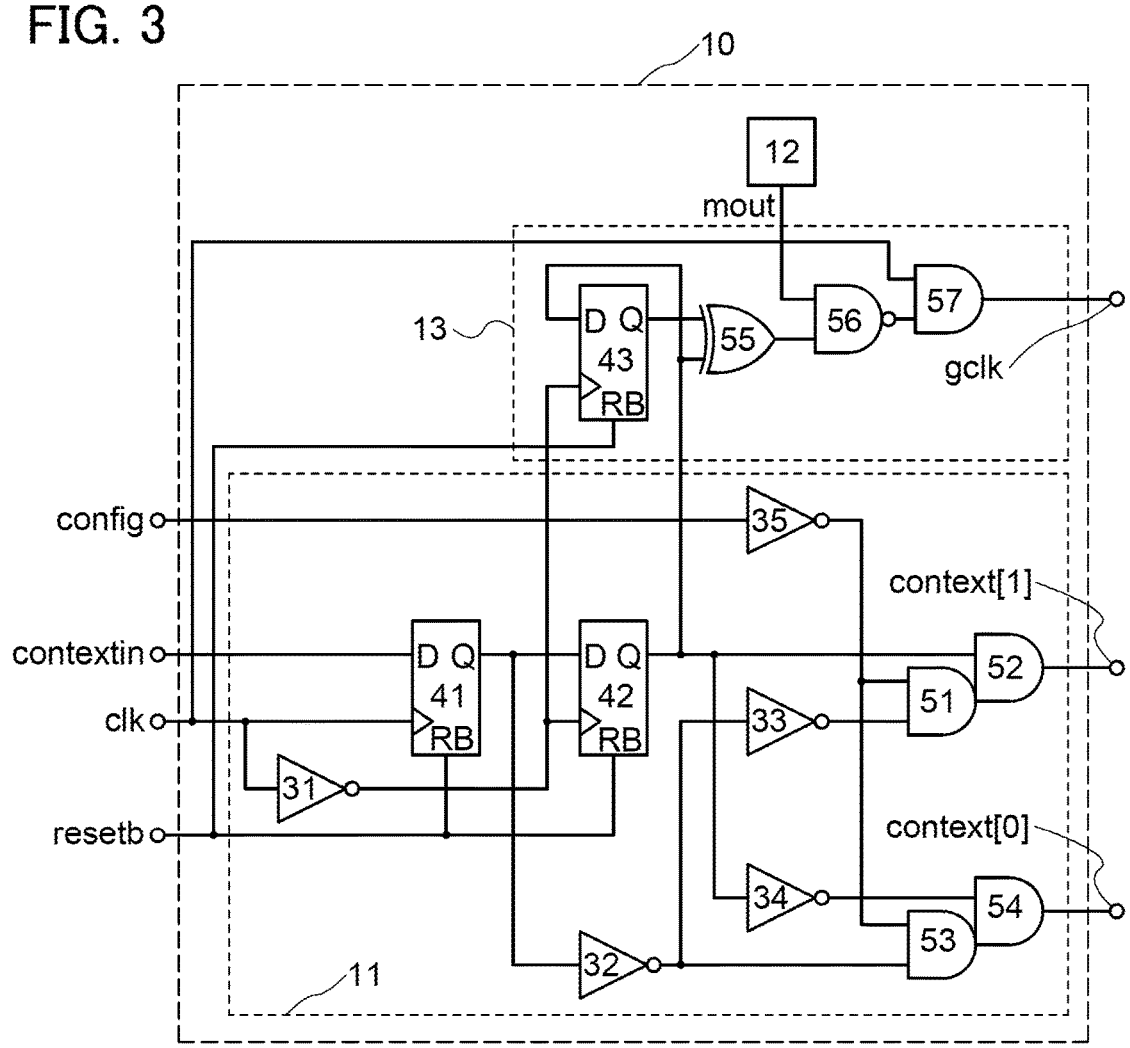
FIG. 3 is a circuit diagram illustrating a configuration example of a semiconductor device.

FIG. 3 is a circuit diagram illustrating a configuration example of the controller 10 illustrated in FIG. 2A. The controller 10 includes, as described above, the context generator 11, the configuration memory 12, and the clock generator 13.

The context generator 11 includes an inverter 31, an inverter 32, an inverter 33, an inverter 34, an inverter 35, a flip-flop 41, a flip-flop 42, an AND circuit 51, an AND circuit 52, an AND circuit 53, and an AND circuit 54. The clock generator 13 includes a flip-flop 43, an XOR circuit 55, an NAND circuit 56, and an AND circuit 57.

An input terminal of the inverter 31 is electrically connected to a clock input terminal of the flip-flop 41 and a first input terminal of the AND circuit 57. An output terminal of the inverter 31 is electrically connected to a clock input terminal of the flip-flop 42 and a clock input terminal of the flip-flop 43.

An input terminal of the inverter 32 is electrically connected to a data output terminal of the flip-flop 41 and a data input terminal of the flip-flop 42. An output terminal of the inverter 32 is electrically connected to an input terminal of the inverter 33 and a second input terminal of the AND circuit 53.

An output terminal of the inverter 33 is electrically connected to a second input terminal of the AND circuit 51.

An input terminal of the inverter 34 is electrically connected to a data output terminal of the flip-flop 42, a data input terminal of the flip-flop 43, a first input terminal of the AND circuit 52, and a second input terminal of the XOR circuit 55. An output terminal of the inverter 34 is electrically connected to a first input terminal of the AND circuit 54.

An output terminal of the inverter 35 is electrically connected to a first input terminal of the AND circuit 51 and a first input terminal of the AND circuit 53.

A data output terminal of the flip-flop 43 is electrically connected to a first input terminal of the XOR circuit 55.

An output terminal of the AND circuit 51 is electrically connected to a second input terminal of the AND circuit 52. An output terminal of the AND circuit 53 is electrically connected to a second input terminal of the AND circuit 54.

A first input terminal of the NAND circuit 56 is electrically connected to the configuration memory 12. A second input terminal of the NAND circuit 56 is electrically connected to an output terminal of the XOR circuit 55. An output terminal of the NAND circuit 56 is electrically connected to a second input terminal of the AND circuit 57.

The signal clk can be input to the clock input terminal of the flip-flop 41 and the first input terminal of the AND circuit 57. The signal resetb can be input to reset input terminals of the flip-flops 41, 42, and 43. The signal config can be input to an input terminal of the inverter 35. The signal contextin can be input to a data input terminal of the flip-flop 41.

The inverter 31 has a function of generating an inverted signal of the signal clk.

The flip-flop 41 has a function of generating a data output signal synchronized with the rise of the signal clk from the signal contextin. In the case where the potential of the signal contextin is at an H level, for example, the flip-flop 41 generates a data output signal having an H level potential at the rise of the signal clk.

The flip-flop 42 has a function of generating a data output signal synchronized with the fall of the signal clk from the data output signal generated by the flip-flop 41. In the case where a data output signal having an H level potential is generated by the flip-flop 41, for example, the flip-flop 42 generates a data output signal having an H level potential at the fall of the signal clk.

A circuit consisting of the inverter 32, the inverter 34, the inverter 35, the AND circuit 53, and the AND circuit 54 has a function of generating the signal context[0]. A circuit consisting of the inverter 32, the inverter 33, the inverter 35, the AND circuit 51, and the AND circuit 52 has a function of generating the signal context[1]. Note that for both of the circuits, the data output signal of the flip-flop 41, the data output signal of the flip-flop 42, and the signal config are input signals.

The flip-flop 43 has a function of generating a data output signal synchronized with the fall of the signal clk from the data output signal generated by the flip-flop 42. Accordingly, the logic of the data output signal generated by the flip-flop 43 is changed one clock after the logic change of the data output signal generated by the flip-flop 42.

The XOR circuit 55 has a function of outputting a signal having an H level potential when the logic of the data output signal generated by the flip-flop 42 is different from the logic of the data output signal generated by the flip-flop 43 and outputting a signal having an L level potential when the data output signals have the same logic. Context switch occurs at the same time as the logic change of the data output signal generated by the flip-flop 42; thus, the XOR circuit 55 outputs a signal having an H level potential at the instant when context switch occurs, and outputs a signal having an L level potential at the next fall of the signal clk. In other words, the XOR circuit 55 enables a pulse signal to be obtained at the timing of context switch.

The NAND circuit 56 has a function of generating a control signal for clock gating performed on the PLD 20. Clock gating can be performed on the PLD 20 in the case where the potential of the signal mout is at an H level and the potential of the signal output from the XOR circuit 55 is at an H level, and no clock gating can be performed in the other cases, for example.

The AND circuit 57 has a function of generating the signal gclk whose logic corresponds to the logic of the signal clk when a signal having an H level potential is output from the NAND circuit 56 and generating the signal gclk whose potential is fixed at an L level when a signal having an L level potential is output from the NAND circuit 56.

Figure 4A:
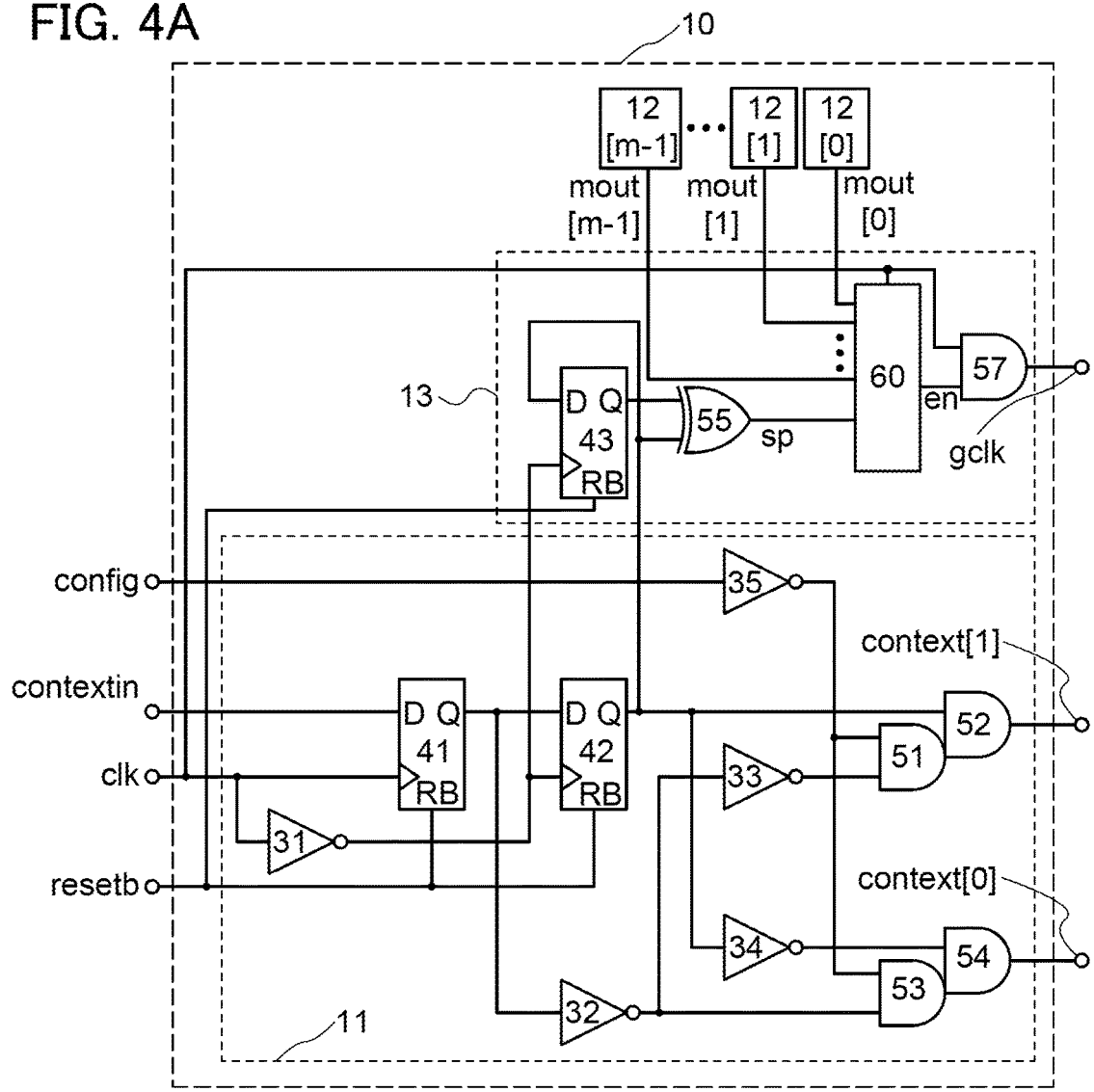
FIGS. 4A and 4B are circuit diagrams illustrating a configuration example of a semiconductor device.

FIG. 4A is a circuit diagram illustrating a configuration example of the controller 10 illustrated in FIG. 2B.

The controller 10 with the configuration illustrated in FIG. 4A is different from the controller 10 with the configuration illustrated in FIG. 3 in including a clock gating control circuit 60 instead of the NAND circuit 56 and including the configuration memories 12[0] to 12[m−1].

When a signal output from the output terminal of the XOR circuit 55 is a signal sp, the signal clk, the signals mout[0] to mout[m−1], and the signal sp can be input to the clock gating control circuit 60.

The clock gating control circuit 60 has a function of outputting a signal en for controlling clock gating performed on the PLD 20. For example, the number of clocks during which clock gating is performed on the PLD 20 is determined on the basis of the logic of the signals mout[0] to mout[m−1], and the signal en having an L level potential is output for the number of clocks. The signal en is input to the second input terminal of the AND circuit 57; thus, in a period during which the clock gating control circuit 60 outputs the signal en having an L level potential, the potential of the signal gclk is at an L level regardless of the logic of the signal clk. Meanwhile, in a period during which the clock gating control circuit 60 outputs the signal en having an H level potential, the logic of the signal gclk corresponds to the logic of the signal clk. This means that clock gating can be performed on the PLD 20 in a period during which the potential of the signal en is at an L level.

According to the above, the signal en serves as an enable signal for clock gating.

Note that the logic of the signal en may be inverted. That is, the clock generator 13 may have a configuration in which clock gating can be performed on the PLD 20 when the potential of the signal en is at an H level.

Figure 4B:
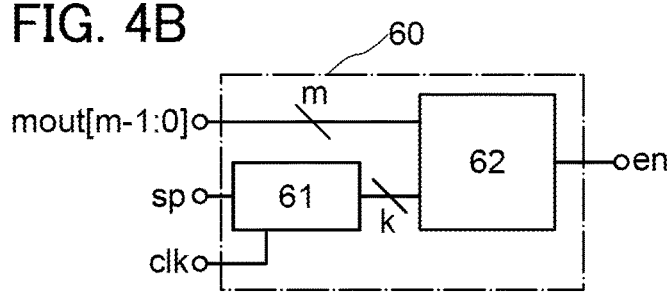

FIG. 4B illustrates a configuration example of the clock gating control circuit 60 illustrated in FIG. 4A. The clock gating control circuit 60 includes a counter circuit 61 and a comparator 62.

The signal clk and the signal sp can be input to the counter circuit 61, and the signals mout[0] to mout[m−1] can be input to the comparator 62.

The counter circuit 61 has functions of counting clock pulses of the signal clk and outputting k-bit (k is an integer of 2 or more) signals. The comparator 62 has functions of comparing the binary number based on the logic of the k-bit signals output from the counter circuit 61 and the binary number based on the logic of the m-bit signals mout with each other and outputting the signal en whose logic is determined in accordance with the comparison result. Note that the numerical range of data on the m-bit signals mout can be controlled by an internal logic when four arithmetic operations are performed.

Described here is the operation of the clock gating control circuit 60. When the potential of the signal sp is at an H level, a register included in the counter circuit 61 is initialized. As a result, the potentials of the k-bit signals output from the counter circuit 61 all become an L level. Thus, the potential of the signal en becomes an L level, leading to the start of clock gating performed on the PLD 20.

Next, the counter circuit 61 starts counting in synchronization with the rise or fall of the signal clk. After the counting starts, the comparator 62 compares the binary number based on the logic of the k-bit signals output from the counter circuit 61 and the binary number based on the logic of the m-bit signals mout with each other, and outputs the signal en having an H level potential when the value output from the counter circuit 61 is greater than or equal to the value of the signal mout. Accordingly, clock gating performed on the PLD 20 terminates.

The above is the operation of the clock gating control circuit 60. Note that after clock gating terminates, the counter circuit 61 counts up to full count and then stops its operation while holding the counted value, for example. The term "full count" means that the potentials of the k-bit signals output from the counter circuit 61 all become an H level.

Figure 5:
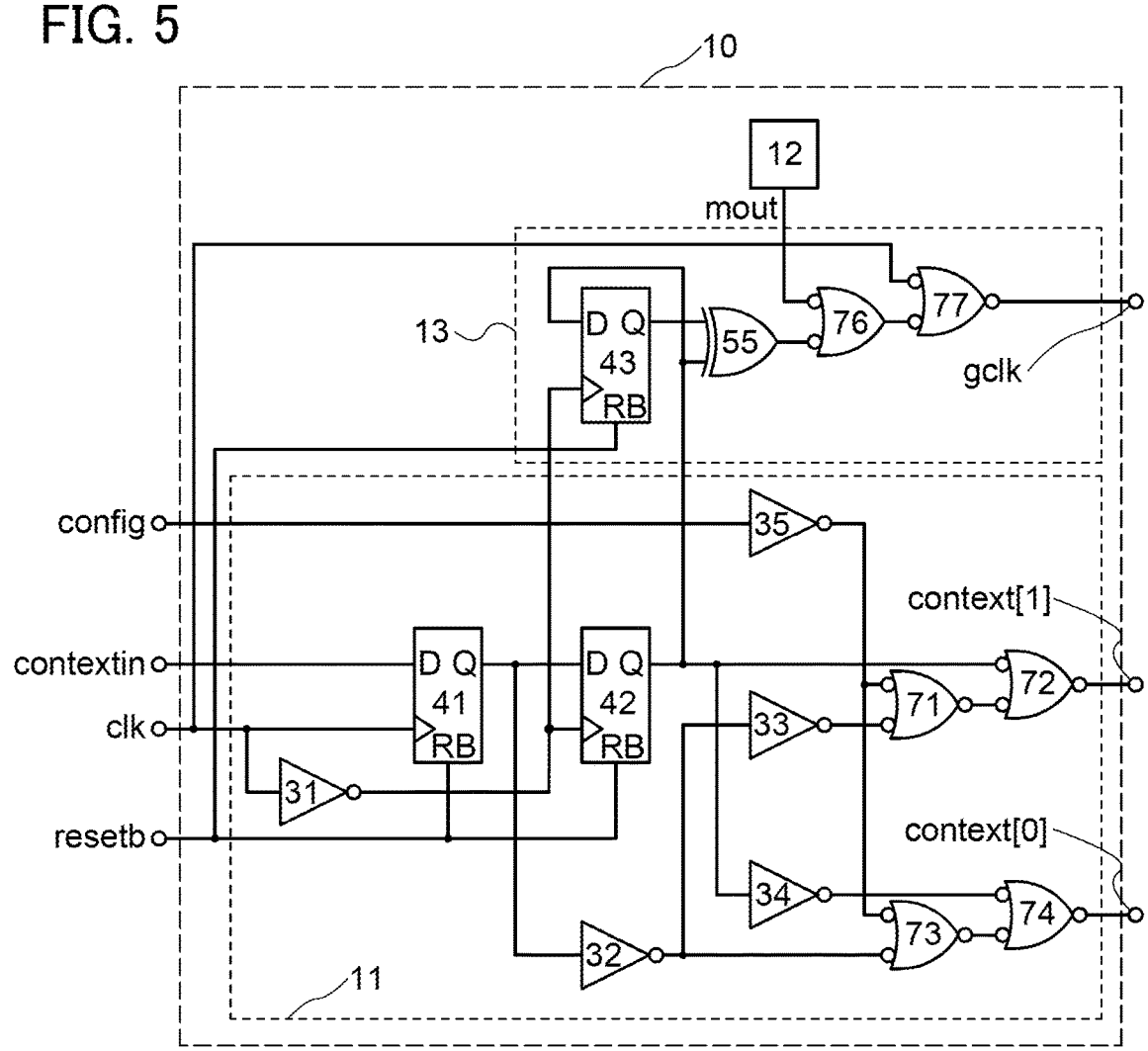
FIG. 5 is a circuit diagram illustrating a configuration example of a semiconductor device.
Figure 6:
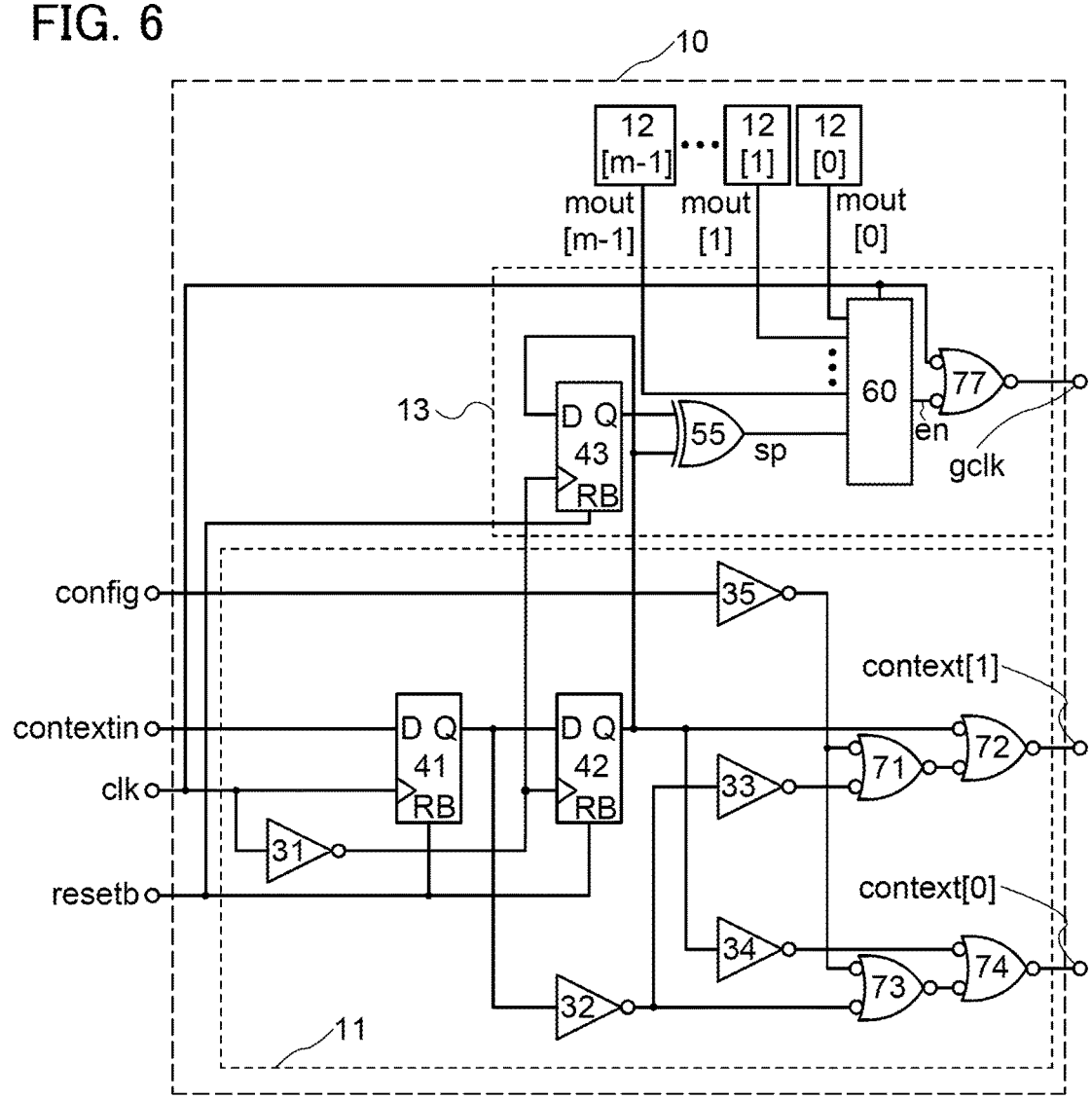
FIG. 6 is a circuit diagram illustrating a configuration example of a semiconductor device.

Note that the circuit configurations illustrated in FIG. 3 and FIGS. 4A and 4B are only examples, and any other configuration can be employed as long as one embodiment of the present invention can be achieved. For example, the AND circuit 51, the AND circuit 52, the AND circuit 53, the AND circuit 54, the NAND circuit 56, and the AND circuit 57 in FIG. 3 may be replaced by a circuit 71, a circuit 72, a circuit 73, a circuit 74, a circuit 76, and a circuit 77, respectively, as illustrated in FIG. 5. For another example, the AND circuits 51 to 54 and the AND circuit 57 in FIG. 4A may be replaced by the circuits 71 to 74 and the circuit 77, respectively, as illustrated in FIG. 6.

<PLE>

Figure 7A:
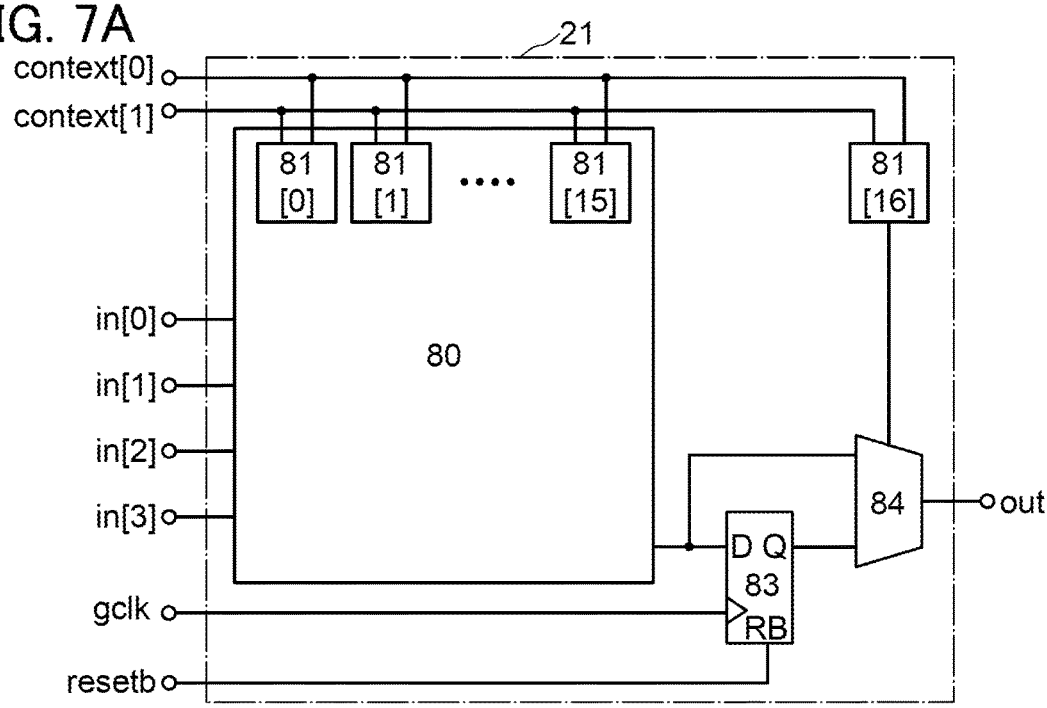
FIGS. 7A and 7B are circuit diagrams each illustrating a configuration example of a semiconductor device.
Figure 7B:
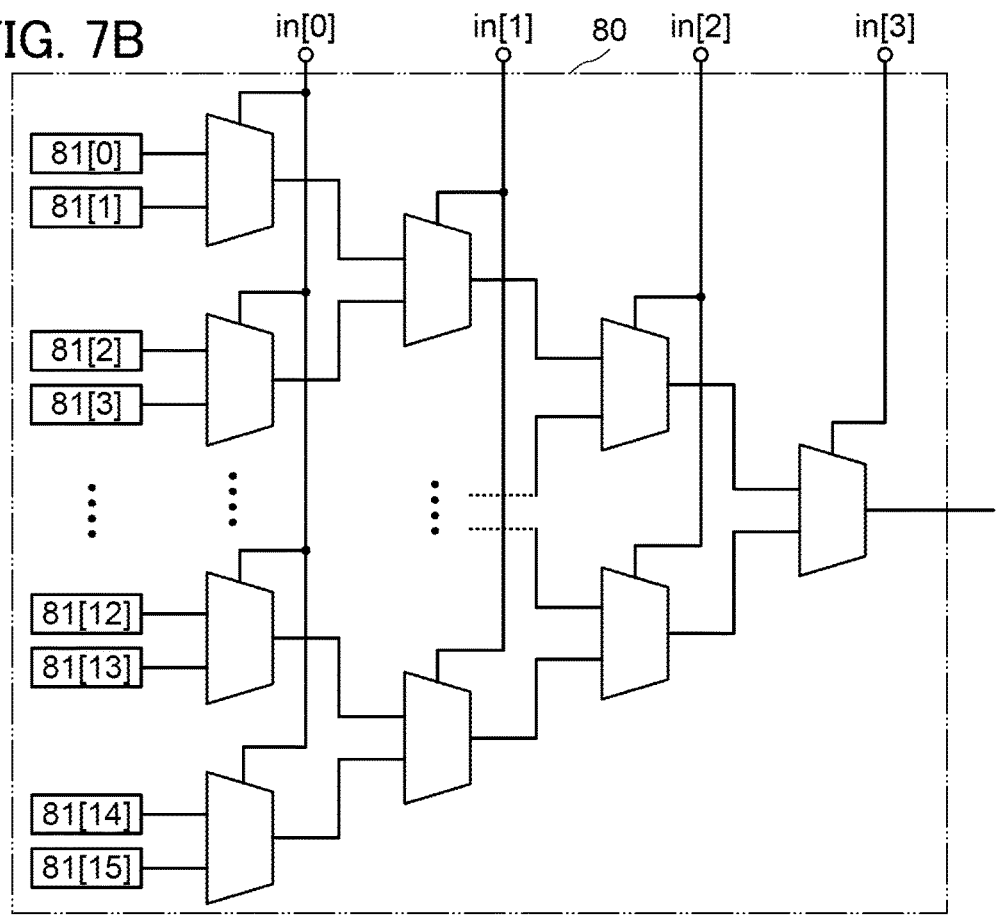

FIG. 7A is a circuit diagram illustrating a configuration example of the PLE 21 illustrated in FIGS. 2A and 2B. The PLE 21 includes a look-up table 80, a flip-flop 83, and a multiplexer 84. The look-up table 80 includes configuration memories 81[0] to 81[16]. FIG. 7B illustrates a configuration example of the look-up table illustrated in FIG. 7A.

The look-up table 80 is electrically connected to a data input terminal of the flip-flop 83 and a first input terminal of the multiplexer 84. The configuration memory 81[16] is electrically connected to a selection signal input terminal of the multiplexer 84. A data output terminal of the flip-flop 83 is electrically connected to a second input terminal of the multiplexer 84.

Signals in[0] to in[3] can be input to the look-up table 80. The signals context[0] and context[1] can be input to the configuration memories 81[0] to 81[16]. The signal gclk can be input to a clock input terminal of the flip-flop 83. The signal resetb can be input to a reset input terminal of the flip-flop 83.

The look-up table 80 has a function of outputting an output signal of one of the configuration memories 81[0] to 81[15] in accordance with the logic of the signals in[0] to in[3], as illustrated in FIG. 7B. Similarly to the configuration memory 12, the configuration memories 81[0] to 81[16] each have functions of retaining configuration data and generating a signal corresponding to the retained configuration data. The flip-flop 83 has a function of performing either retention or output to the second input terminal of the multiplexer 84, of the output signal from the look-up table 80 depending on the logic of the signal gclk. The multiplexer 84 has a function of outputting, as a signal out, a signal with the logic that corresponds to the logic of one of the signal output from the look-up table 80 and the signal output from the data output terminal of the flip-flop 83 in accordance with the logic of the signal output from the configuration memory 81[16].

Although the look-up table 80 is a 4-input look-up table here, one embodiment of the present invention is not limited thereto. For example, the look-up table 80 may be a 6-input look-up table or a p-input look-up table (p is an integer of 2 or more).

<Configuration Memory>

Figure 8:
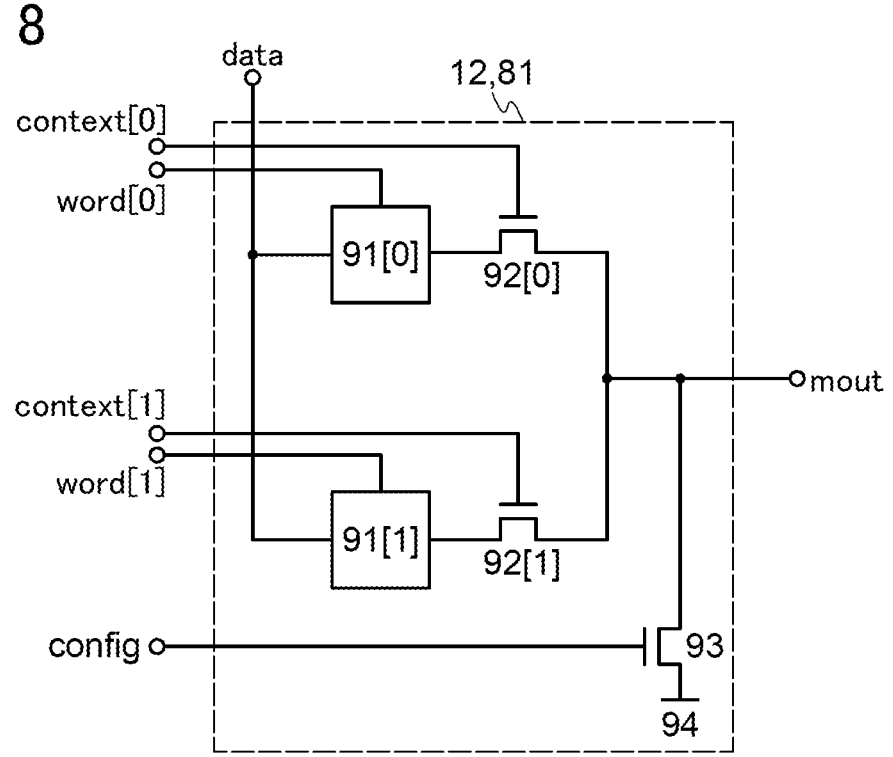
FIG. 8 is a circuit diagram illustrating a configuration example of a semiconductor device.

FIG. 8 is a circuit diagram illustrating a configuration example for each of the configuration memory 12 illustrated in FIGS. 2A and 2B and the configuration memory 81 illustrated in FIGS. 7A and 7B. The configuration memory 12 and the configuration memory 81 each include a memory cell 91[0], a memory cell 91[1], a transistor 92[0], a transistor 92[1], a transistor 93, and a wiring 94.

Although FIG. 8 illustrates an example where the transistor 92[0], the transistor 92[1], and the transistor 93 are all n-channel transistors, one embodiment of the present invention is not limited thereto; some or all of the transistors may be p-channel transistors.

In this specification, an n-channel transistor is referred to as an n-ch transistor and a p-channel transistor is referred to as a p-ch transistor in some cases.

The memory cell 91[0] is electrically connected to one of a source and a drain of the transistor 92[0]. The memory cell 91[1] is electrically connected to one of a source and a drain of the transistor 92[1]. The other of the source and the drain of the transistor 92[0] is electrically connected to the other of the source and the drain of the transistor 92[1] and one of a source and a drain of the transistor 93. The other of the source and the drain of the transistor 93 is electrically connected to the wiring 94.

A signal data can be input to the memory cell 91[0] and the memory cell 91[1]. A signal word[0] can be input to the memory cell 91[0]. A signal word[1] can be input to the memory cell 91[1]. The signal context[0] can be input to a gate of the transistor 92[0]. The signal context[1] can be input to a gate of the transistor 92[1]. The signal config can be input to a gate of the transistor 93.

The memory cell 91[0] and the memory cell 91[1] each have a function of retaining configuration data. The transistor 92[0] has a function of determining, on the basis of the potential of the signal context[0], whether or not to output data based on configuration data retained in the memory cell 91[0] as the signal mout to the outside of the configuration memory 12 and the configuration memory 81. The transistor 92[1] has a function of determining, on the basis of the potential of the signal context[1], whether or not to output data based on configuration data retained in the memory cell 91[1] as the signal mout to the outside of the configuration memory 12 and the configuration memory 81.

This means that, in the case where the potential of the signal context[0] is at an H level, the potential of the signal mout becomes an H level when the potential of configuration data retained in the memory cell 91[0] is at an H level, whereas the potential of the signal mout becomes an L level when the potential of configuration data retained in the memory cell 91[0] is at an L level, for example. Furthermore, in the case where the potential of the signal context[1] is at an H level, the potential of the signal mout becomes an H level when the potential of configuration data retained in the memory cell 91[1] is at an H level, whereas the potential of the signal mout becomes an L level when the potential of configuration data retained in the memory cell 91[1] is at an L level, for example.

Note that the logic of the signal context[0] and the signal context[1] can be inverted as appropriate. Furthermore, the configuration memory 12 and the configuration memory 81 can each have a configuration in which the potential of the signal mout becomes an L level when the potential of configuration data retained in the memory cell 91[0] is at an H level and the potential of the signal mout becomes an H level when the potential of configuration data retained in the memory cell 91[0] is at an L level, for example. Alternatively, for example, a configuration can be employed in which the potential of the signal mout becomes an L level when the potential of configuration data retained in the memory cell 91[1] is at an H level and the potential of the signal mout becomes an H level when the potential of configuration data retained in the memory cell 91[1] is at an L level.

The signal data has a function of supplying configuration data to the memory cell 91[0] and the memory cell 91[1]. The signal word[0] serves as a write control signal for controlling the writing of configuration data to the memory cell 91[0]. The signal word[1] serves as a write control signal for controlling the writing of configuration data to the memory cell 91[1].

The transistor 93 has a function of fixing the potential of the signal mout at the potential of the wiring 94 during configuration operation. Note that an L level potential can be applied to the wiring 94, for example.

Figure 9A:
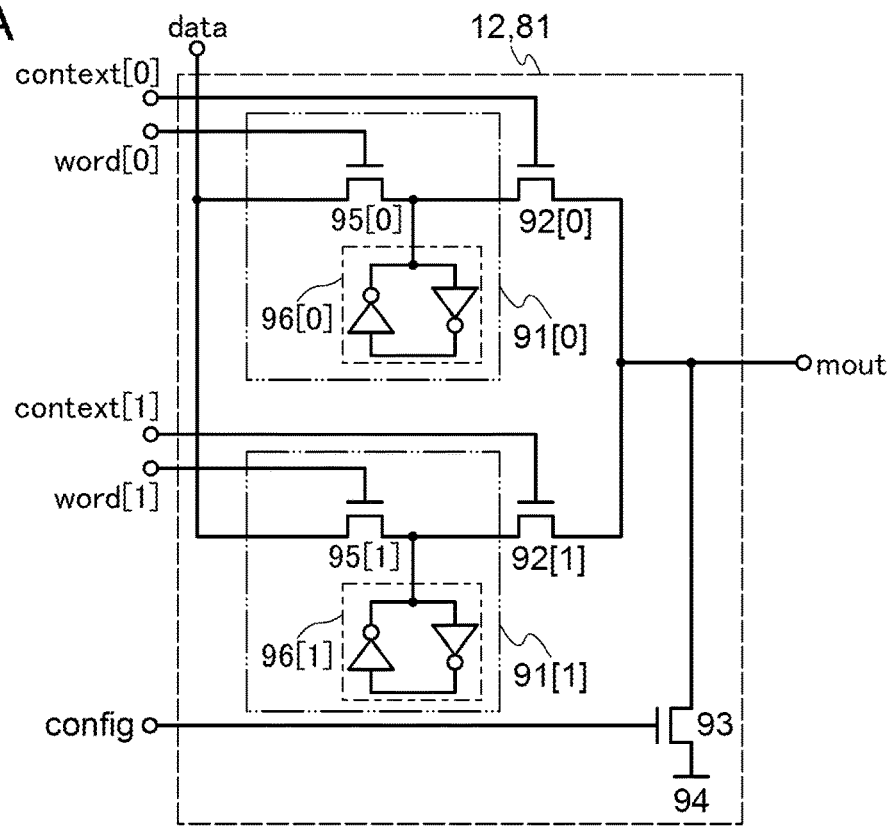
FIGS. 9A and 9B are circuit diagrams each illustrating a configuration example of a semiconductor device.
Figure 9B:
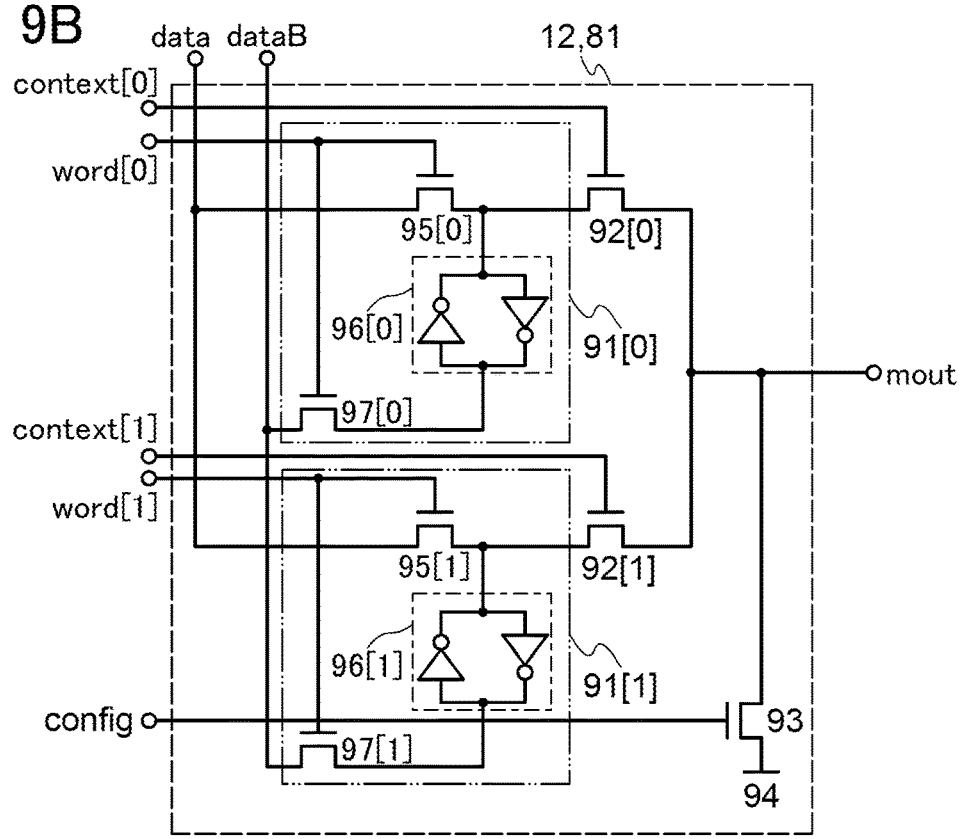

As illustrated in FIG. 9A, the memory cell 91[0] illustrated in FIG. 8 may include a transistor 95[0] and a latch circuit 96[0], and the memory cell 91[1] illustrated in FIG. 8 may include a transistor 95[1] and a latch circuit 96[1], for example. Alternatively, as illustrated in FIG. 9B, a configuration in which a signal dataB, which is data (complementary data) obtained by inverting the logic of the signal data, can be supplied to the latch circuit 96[0] and the latch circuit 96[1] may be employed. In that case, the signal dataB is supplied to the latch circuit 96[0] through a transistor 97[0] and to the latch circuit 96[1] through a transistor 97[1].

Figure 10A:
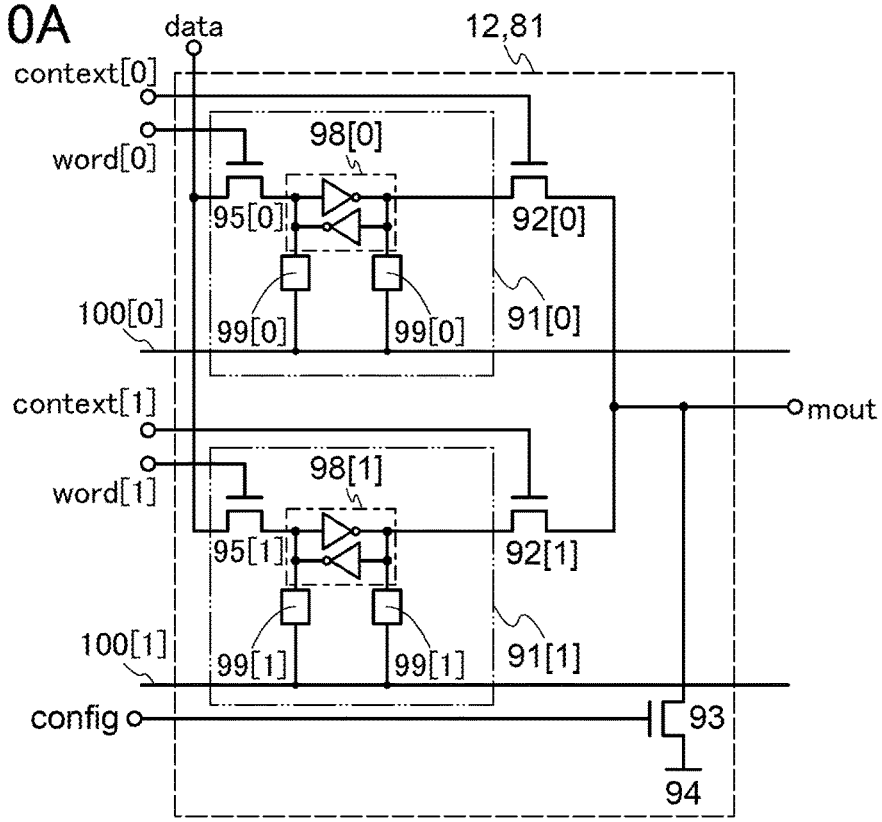
FIGS. 10A and 10B are circuit diagrams each illustrating a configuration example of a semiconductor device.

As illustrated in FIG. 10A, a configuration may be employed in which the memory cell 91[0] includes the transistor 95[0], a latch circuit 98[0], magnetoresistive random access memories (MRAMs) 99[0], and a wiring 100[0] and the memory cell 91[1] includes the transistor 95[1], a latch circuit 98[1], MRAMs 99[1], and a wiring 100[1]. Alternatively, as illustrated in FIG. 10B, a configuration may be employed in which the latch circuit 98[0] is connected to the MRAMs 99[0] through transistors 101[0] and the latch circuit 98[1] is connected to the MRAMs 99[1] through transistors 101[1].

Figure 10B:
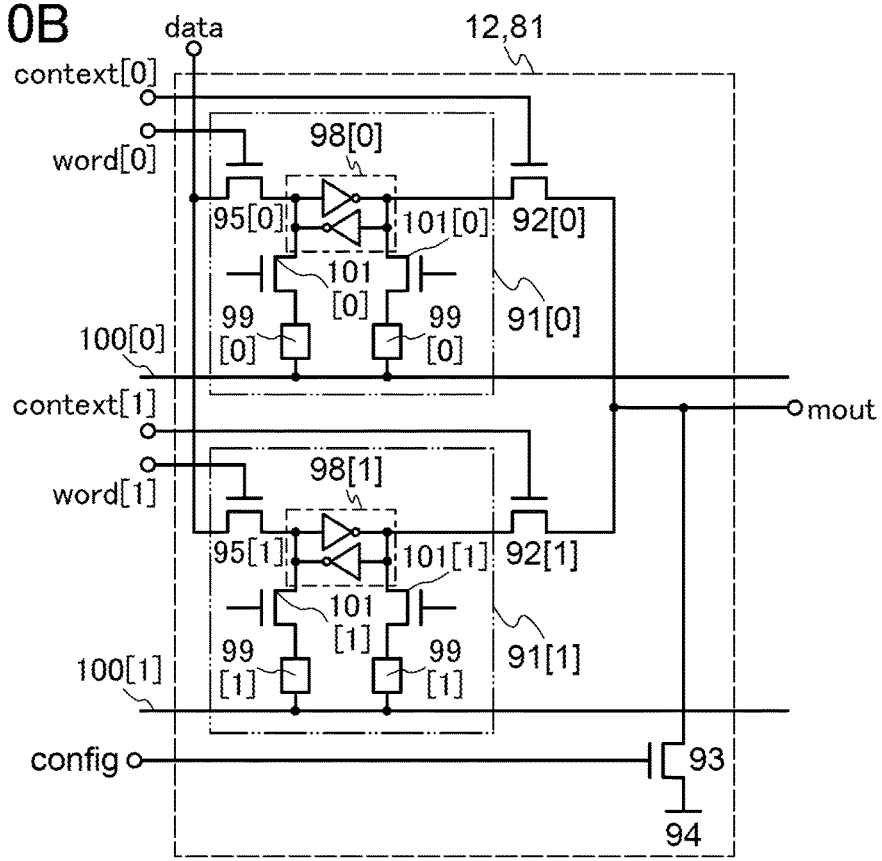

Note that the memory cell 91[0] and the memory cell 91[1] with the configurations illustrated in FIG. 10A or FIG. 10B do not necessarily include the latch circuit 98[0] and the latch circuit 98[1].

Figure 11:
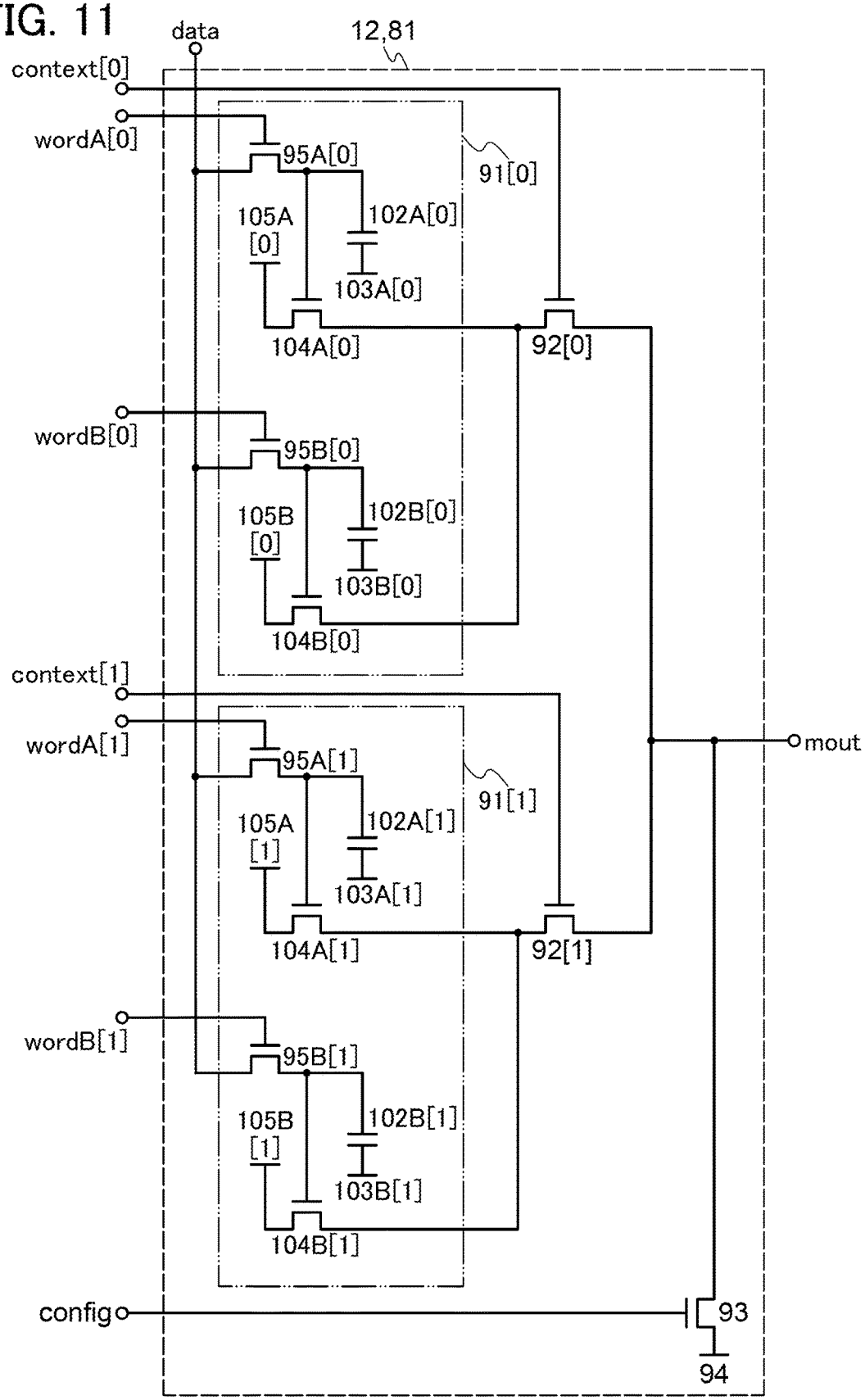
FIG. 11 is a circuit diagram illustrating a configuration example of a semiconductor device.

The memory cell 91[0] and the memory cell 91[1] illustrated in FIG. 8 can have configurations illustrated in FIG. 11. The memory cell 91[0] illustrated in FIG. 11 includes a transistor 95A[0], a transistor 95B[0], a capacitor 102A[0], a capacitor 102B[0], a wiring 103A[0], a wiring 103B[0], a transistor 104A[0], a transistor 104B[0], a wiring 105A[0], and a wiring 105B[0]. The memory cell 91[1] includes a transistor 95A[1], a transistor 95B[1], a capacitor 102A[1], a capacitor 102B[1], a wiring 103A[1], a wiring 103B[1], a transistor 104A[1], a transistor 104B[1], a wiring 105A[1], and a wiring 105B[1].

Although described here is an example where the transistor 95A[0], the transistor 95B[0], the transistor 95A[1], the transistor 95B[1], the transistor 104A[0], the transistor 104B[0], the transistor 104A[1], and the transistor 104B[1] are all n-ch transistors, one embodiment of the present invention is not limited thereto; some or all of the transistors may be p-ch transistors.

One of a source and a drain of the transistor 95A[0] is electrically connected to one terminal of the capacitor 102A[0] and a gate of the transistor 104A[0]. One of a source and a drain of the transistor 95B[0] is electrically connected to one terminal of the capacitor 102B[0] and a gate of the transistor 104B[0]. The other terminal of the capacitor 102A[0] is electrically connected to the wiring 103A[0]. The other terminal of the capacitor 102B[0] is electrically connected to the wiring 103B[0].

One of a source and a drain of the transistor 104A[0] is electrically connected to one of a source and a drain of the transistor 92[0] and one of a source and a drain of the transistor 104B[0]. The other of the source and the drain of the transistor 104A[0] is electrically connected to the wiring 105A[0]. The other of the source and the drain of the transistor 104B[0] is electrically connected to the wiring 105B[0].

One of a source and a drain of the transistor 95A[1] is electrically connected to one terminal of the capacitor 102A[1] and a gate of the transistor 104A[1]. One of a source and a drain of the transistor 95B[1] is electrically connected to one terminal of the capacitor 102B[1] and a gate of the transistor 104B[1]. The other terminal of the capacitor 102A[1] is electrically connected to the wiring 103A[1]. The other terminal of the capacitor 102B[1] is electrically connected to the wiring 103B[1].

One of a source and a drain of the transistor 104A[1] is electrically connected to one of a source and a drain of the transistor 92[1] and one of a source and a drain of the transistor 104B[1]. The other of the source and the drain of the transistor 104A[1] is electrically connected to the wiring 105A[1]. The other of the source and the drain of the transistor 104B[1] is electrically connected to the wiring 105B[1].

The potentials of the wiring 103A[0], the wiring 103B[0], the wiring 103A[1], and the wiring 103B[1] can be at an L level, for example. Furthermore, the wiring 105A[0] and the wiring 105B[0] are supplied with potentials with opposite logic levels, and the wiring 105A[1] and the wiring 105B[1] are supplied with potentials with opposite logic levels. For example, the potential of the wiring 105B[0] is at an L level when the potential of the wiring 105A[0] is at an H level. For another example, the potential of the wiring 105B[1] is at an L level when the potential of the wiring 105A[1] is at an H level.

The signal data can be input to the other of the source and the drain of the transistor 95A[0], the other of the source and the drain of the transistor 95B[0], the other of the source and the drain of the transistor 95A[1], and the other of the source and the drain of the transistor 95B[1]. A signal wordA[0] can be input to a gate of the transistor 95A[0]. A signal wordB[0] can be input to a gate of the transistor 95B[0]. A signal wordA[1] can be input to a gate of the transistor 95A[1]. A signal wordB[1] can be input to a gate of the transistor 95B[1].

Note that two types of signals word[0] can be input to the memory cell 91[0] with the configuration illustrated in FIG. 11. In addition, two types of signals word[1] can be input to the memory cell 91[1] with the configuration illustrated in FIG. 11. The two types of signals word[0] are described as the signal wordA[0] and the signal wordB[0], and the two types of signals word[1] are described as the signal wordA[1] and the signal wordB[1].

The transistor 95A[0] has a function of controlling the writing of configuration data to the capacitor 102A[0]. The transistor 95B[0] has a function of controlling the writing of configuration data to the capacitor 102B[0]. The transistor 95A[1] has a function of controlling the writing of configuration data to the capacitor 102A[1]. The transistor 95B[1] has a function of controlling the writing of configuration data to the capacitor 102B[1].

The capacitor 102A[0], the capacitor 102B[0], the capacitor 102A[1], and the capacitor 102B[1] each have a function of retaining configuration data. The transistor 104A[0] has a function of amplifying configuration data retained in the capacitor 102A[0]. The transistor 104B[0] has a function of amplifying configuration data retained in the capacitor 102B[0]. The transistor 104A[1] has a function of amplifying configuration data retained in the capacitor 102A[1]. The transistor 104B[1] has a function of amplifying configuration data retained in the capacitor 102B[1].

Next, procedures for retention and reading of configuration data in the memory cell 91[0] and the memory cell 91[1] with the configurations illustrated in FIG. 11 will be described. Note that the potentials of the wiring 105A[0] and the wiring 105A[1] are set at an H level and the potentials of the wiring 105B[0] and the wiring 105B[1] are set at an L level.

To retain configuration data having an H level potential in the memory cell 91[0], the potentials of the signal data and the signal wordA[0] are set at an H level. As a result, a charge is held in the capacitor 102A[0] and an H level potential is applied to the gate of the transistor 104A[0]. Thus, the transistor 104A[0] is turned on. Since the potential of the wiring 105A[0] is at an H level, a signal having an H level potential is output as the signal mout when the potential of the signal context[0] becomes an H level and the transistor 92[0] is turned on.

To retain configuration data having an L level potential in the memory cell 91[0], the potentials of the signal data and the signal wordB[0] are set at an H level. As a result, a charge is held in the capacitor 102B[0] and an H level potential is applied to the gate of the transistor 104B[0]. Thus, the transistor 104B[0] is turned on. Since the potential of the wiring 105B[0] is at an L level, a signal having an L level potential is output as the signal mout when the potential of the signal context[0] becomes an H level and the transistor 92[0] is turned on.

To retain configuration data having an H level potential in the memory cell 91[1], the potentials of the signal data and the signal wordA[1] are set at an H level. To retain configuration data having an L level potential in the memory cell 91[1], the potentials of the signal data and the signal wordB[1] are set at an H level.

In the memory cell 91[0] with the configuration illustrated in FIG. 11, a reduction in the off-state current of the transistor 95A[0] leads to long retention time of a charge written to the capacitor 102A[0], and a reduction in the off-state current of the transistor 95B[0] leads to long retention time of a charge written to the capacitor 102B[0]. Furthermore, a reduction in the off-state current of the transistor 95A[1] leads to long retention time of a charge written to the capacitor 102A[1], and a reduction in the off-state current of the transistor 95B[1] leads to long retention time of a charge written to the capacitor 102B[1]. Here, off-state current refers to current that flows between a source and a drain when a transistor is off. In the case of an n-ch transistor, for example, when its threshold voltage is approximately 0 V to 2 V, current flowing between a source and a drain when a gate voltage is negative with respect to source and drain voltages can be referred to as off-state current. An ultralow off-state current means that, for example, an off-state current per micrometer of channel width is lower than or equal to 100 zA (zeptoamperes). Since the off-state current is preferably as low as possible, the normalized off-state current is preferably lower than or equal to 10 zA/μm or lower than or equal to 1 zA/μm, further preferably lower than or equal to 10 yA/μm (yA: yoctoamperes). Note that 1 zA is $1\times10^{-21}$ A and 1 yA is $1\times10^{-24}$ A.

To obtain such an ultralow off-state current, a channel formation region of a transistor is formed using a semiconductor with a wide bandgap. An example of such a semiconductor is an oxide semiconductor. An oxide semiconductor has a bandgap of 3.0 eV or more; thus, a transistor whose active layer or active region contains an oxide semiconductor (OS transistor) has a low leakage current caused by thermal excitation and has an ultralow off-state current. A channel formation region of an OS transistor is preferably formed using an oxide semiconductor containing at least one of indium (In) and zinc (Zn). A typical example of such an oxide semiconductor is an In-M-Zn oxide (the element M is Al, Ga, Y, or Sn, for example). By reducing impurities serving as electron donors, such as moisture or hydrogen, and also reducing oxygen vacancies, an i-type (intrinsic) or a substantially i-type oxide semiconductor can be obtained. Here, such an oxide semiconductor can be referred to as a highly purified oxide semiconductor. By using a highly purified oxide semiconductor, the off-state current normalized by channel width of an OS transistor can be as low as several yoctoamperes per micrometer to several zeptoamperes per micrometer.

In addition, the OS transistor has lower temperature dependence of off-state current characteristics than a transistor whose active layer or active region formed using silicon (hereinafter such a transistor is referred to as a Si transistor). Thus, the normalized off-state current of the OS transistor can be less than or equal to 100 zA even at high temperatures (e.g., 100° C. or higher). Accordingly, the use of an OS transistor as the transistor 95A[0] enables a charge written to the capacitor 102A[0] to be retained for a long time even in a high temperature environment, and the use of an OS transistor as the transistor 95B[0] enables a charge written to the capacitor 102B[0] to be retained for a long time even in a high temperature environment. Furthermore, the use of an OS transistor as the transistor 95A[1] enables a charge written to the capacitor 102A[1] to be retained for a long time even in a high temperature environment, and the use of an OS transistor as the transistor 95B[1] enables a charge written to the capacitor 102B[1] to be retained for a long time even in a high temperature environment. According to the above, a semiconductor device that is highly reliable even in a high temperature environment can be obtained.

Note that the transistor 92[0], the transistor 92[1], the transistor 93, the transistor 104A[0], the transistor 104B[0], the transistor 104A[1], and the transistor 104B[1] can be Si transistors. Since Si transistors have higher field-effect mobility than that of OS transistors, the amounts of current flowing in the transistor 92[0], the transistor 92[1], the transistor 93, the transistor 104A[0], the transistor 104B[0], the transistor 104A[1], and the transistor 104B[1] can be increased. Thus, the semiconductor device of one embodiment of the present invention can operate at high speed.

Alternatively, the transistor 92[0], the transistor 92[1], the transistor 93, the transistor 104A[0], the transistor 104B[0], the transistor 104A[1], and the transistor 104B[1] can be OS transistors. In other words, all of the transistors included in the configuration memory 12 and the configuration memory 81 can be OS transistors.

Further alternatively, some of the transistors included in the configuration memory 12 and the configuration memory 81 can be OS transistors and the rest of the transistors can be Si transistors.

The configurations of the memory cell 91[0] and the memory cell 91[1] are not limited to those illustrated in FIGS. 9A and 9B, FIGS. 10A and 10B, and FIG. 11, and a resistance random access memory (ReRAM) or a flash memory may be included, for example.

Note that the circuit configurations illustrated in FIGS. 7A and 7B, FIG. 8, FIGS. 9A and 9B, FIGS. 10A and 10B, and FIG. 11 are only examples, and any other configuration can be employed as long as one embodiment of the present invention can be achieved.

<PLD>

Figure 12:
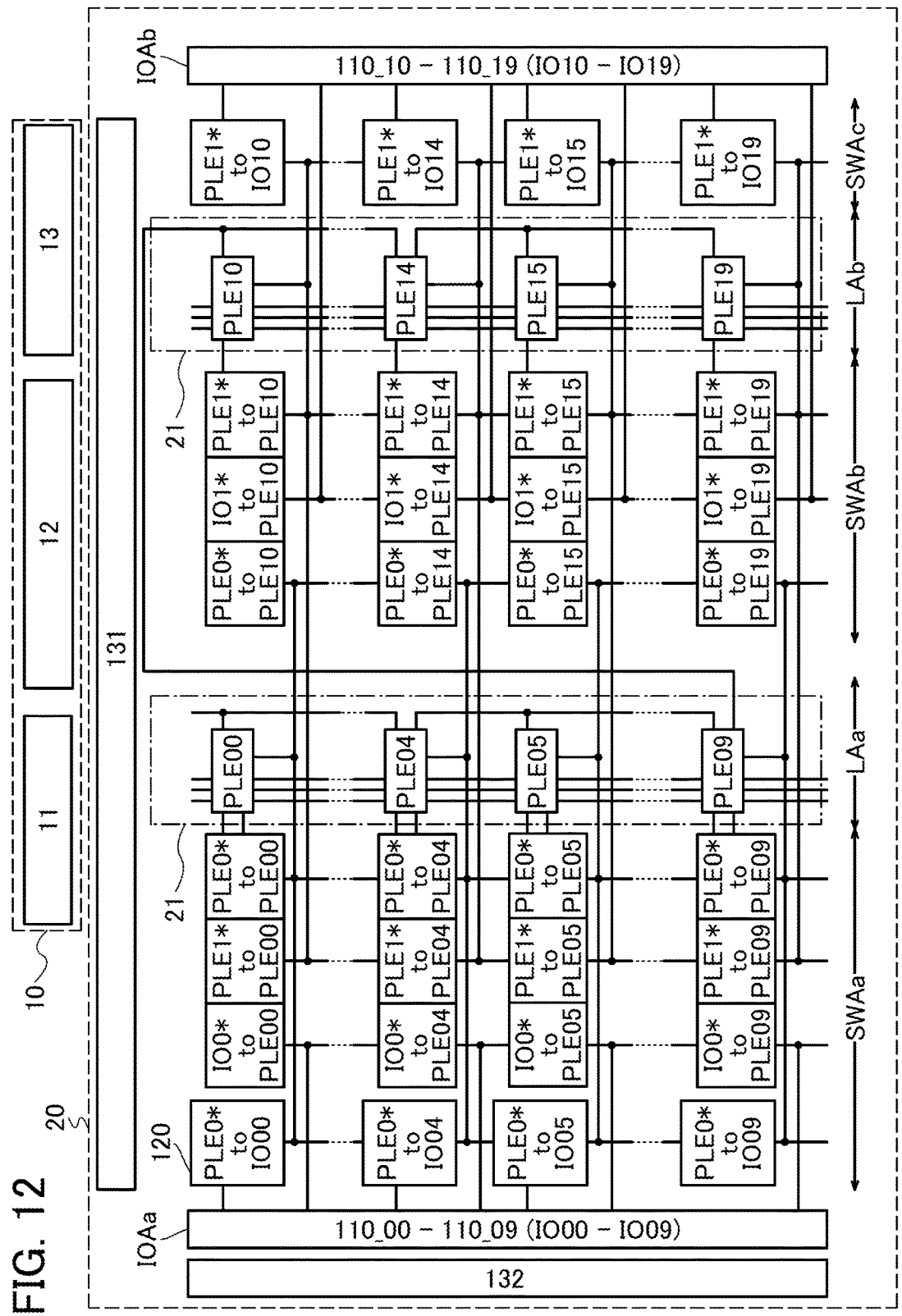
FIG. 12 is a block diagram illustrating a configuration example of a semiconductor device.

FIG. 12 is a block diagram illustrating a configuration example of the semiconductor device of one embodiment of the present invention. FIG. 12 illustrates connection relationships between circuits included in the PLD 20. As described above, the semiconductor device of one embodiment of the present invention includes the controller 10 and the PLD 20, and the controller 10 includes the context generator 11, the configuration memory 12, and the clock generator 13.

The PLD 20 includes, in addition to the PLEs 21, input/output circuits 110, PSEs 120, a column driver 131, and a row driver 132. Note that each of the PSEs 120 can include a configuration memory having a configuration similar to the configurations of the configuration memory 12 and the configuration memory 81.

The input/output circuits 110 each have a function of controlling input and output of signals between the external terminal included in the semiconductor device of one embodiment of the present invention and the PLEs 21. The PSEs 120 each have a function of determining connection relationships between the PLEs 21, connection relationships between the PLEs 21 and the input/output circuits 110, and the like. The column driver 131 has a function of generating the signal data. The row driver 132 has a function of generating the signal word[0] and the signal word[1].

In the example illustrated in FIG. 12, ten PLEs 21 are arranged to form a logic array LAa, and another ten PLEs 21 are arranged to form a logic array LAb. Furthermore, ten input/output circuits 110 are arranged to form an input/output array IOAa, and another ten input/output circuits 110 are arranged to form an input/output array IOAb. In addition, the PSEs 120 are arranged in a matrix to form a switch array SWAa, a switch array SWAb, and a switch array SWAc.

In this specification, ten PLEs 21 included in the logic array LAa are described as PLEs 21_00 to 21_09, ten PLEs 21 included in the logic array LAb are described as PLEs 21_10 to 21_19, ten input/output circuits 110 included in the input/output array IOAa are described as input/output circuits 110_00 to 110_09, and ten input/output circuits 110 included in the input/output array IOAb are described as input/output circuits 110_10 to 110_19.

In FIG. 12, the PLEs 21_00 to 21_19 are denoted by "PLE00" to "PLE19," and the input/output circuits 110_00 to 110_19 are denoted by "IO00" to "IO19," in some cases. Furthermore, notations for the PSEs 120 in FIG. 12 describe the functions of the PSEs 120. For example, "PLE0* to IO00" means that the PSE 120 is placed between an input node of the input/output circuit 110_00 and output nodes of the PLEs 21_00 to 21_09.

Note that the input/output circuits 110_00 to 110_19 are electrically connected to respective external terminals. The input/output arrays IOAa and IOAb have functions of controlling input and output of signals between the external terminals included in the semiconductor device of one embodiment of the present invention and the logic arrays LAa and LAb.

The configurations illustrated in FIGS. 1A and 1B, FIGS. 2A and 2B, FIG. 3, FIGS. 4A and 4B, FIG. 5, FIG. 6, FIGS. 7A and 7B, FIG. 8, FIGS. 9A and 9B, FIGS. 10A and 10B, FIG. 11, and FIG. 12 can be freely combined with one another.

<Operation Example>

An operation example of the semiconductor device having the configuration illustrated in FIG. 2A will be described using a timing chart in FIG. 13A, and an operation example of the semiconductor device having the configuration illustrated in FIG. 2B will be described using a timing chart in FIG. 13B.

Figure 13A:
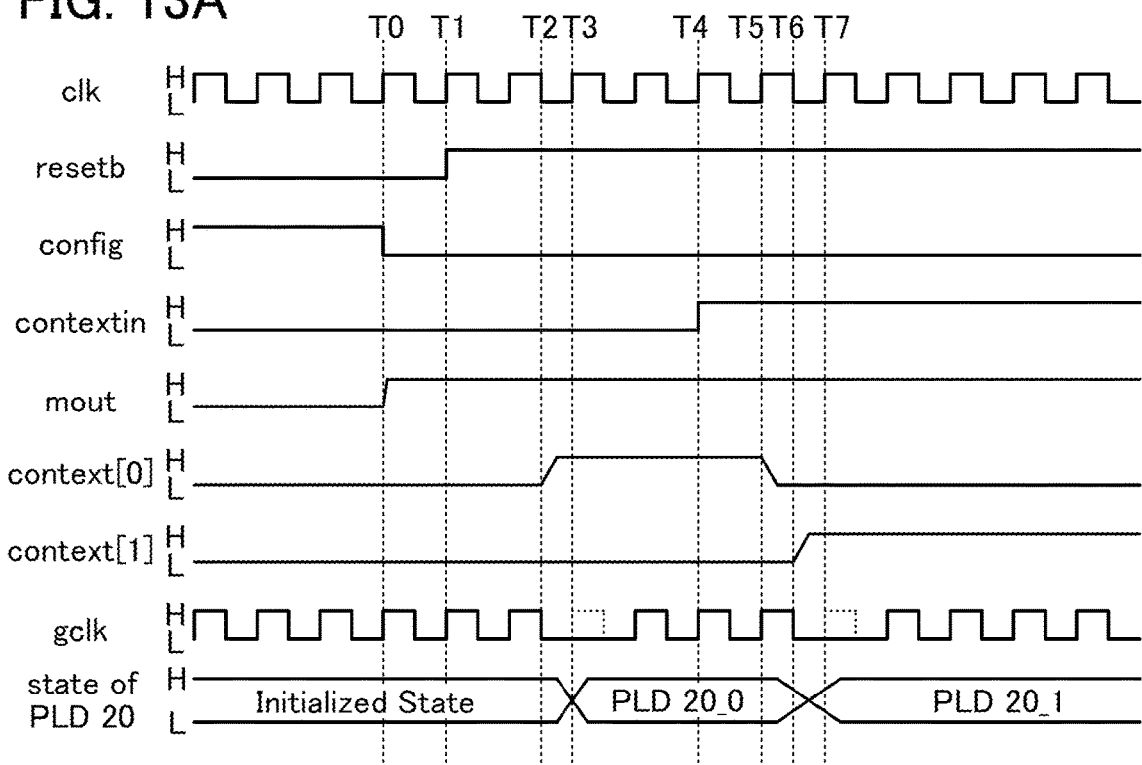
FIGS. 13A and 13B are timing charts each showing an operation example of a semiconductor device.
Figure 13B:
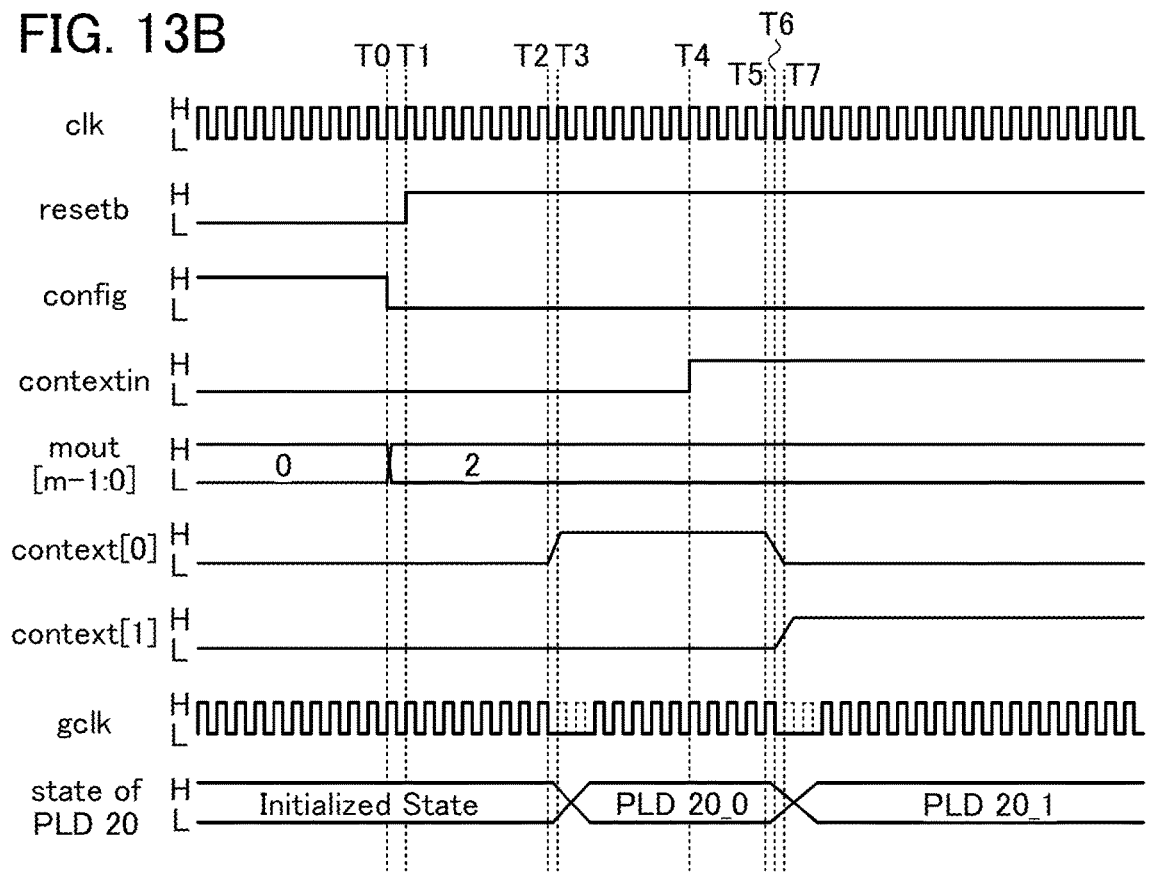

The timing charts in FIGS. 13A and 13B show the potentials of the signal clk, the signal resetb, the signal config, the signal contextin, the signal mout, the signal context[0], the signal context[1], and the signal gclk, and the configuration state of the PLD 20.

When the potential of the signal context[0] is at an H level, the configuration of the PLD 20 corresponds to configuration data retained in the memory cell 91[0] included in the configuration memory 81 or the like, for example. The PLD 20 with such a configuration is represented by "PLD 20_0." When the potential of the signal context[1] is at an H level, the configuration of the PLD 20 corresponds to configuration data retained in the memory cell 91[1] included in the configuration memory 81 or the like, for example. The PLD 20 with such a configuration is represented by "PLD 20_1."

In FIGS. 13A and 13B, the signal gclk changes at the same time as the signal clk except for the case of clock gating. However, there is a lag by propagation delay such as gate delay or RC delay in practice.

First, the operation of the semiconductor device with the configuration illustrated in FIG. 2A is described using the timing chart in FIG. 13A. Before Time T0, the configuration memory 12 performs configuration operation, and the potential of the signal config is at an H level. In addition, the potentials of the signal resetb, the signal contextin, the signal mout, the signal context[0], and the signal context[1] are at an L level.

In the PLD 20, a potential that determines a circuit configuration is fixed at the initial value. In the case where the PLEs 21 included in the PLD 20 each have the configuration illustrated in FIG. 7A, for example, the potentials of the signals in[0] to in[3] and the potentials of signals output from the configuration memories 81[0] to 81[15] are all at an L level. This state of the PLD 20 is called an initial state, in some cases.

At Time T0, the configuration memory 12 terminates configuration operation, and the potential of the signal config is set at an L level in synchronization with the rise of the signal clk. After that, the potential of the signal mout output from the configuration memory 12 becomes a potential corresponding to configuration data that is retained in the memory cell 91[0] illustrated in FIG. 8. Here, the potential of the signal mout is at an H level.

At Time T1, the potential of the signal resetb is set at an H level in synchronization with the rise of the signal clk. Thus, reset states of the flip-flops of the circuits included in the semiconductor device of one embodiment of the present invention are canceled.

At Time T2, the potential of the signal context[0] is set at an H level in synchronization with the fall of the signal clk. Thus, context switch starts, and the transition of the configuration of the PLD 20 from the initial state to the PLD 20_0 starts.

At Time T3, the signal clk rises, but the potential of the signal gclk remains at an L level because the clock generator 13 illustrated in FIG. 2A performs clock gating for one clock. Thus, data setup for the flip-flops included in the PLD 20 can be prevented until the next rise of the signal clk. Although the transition from the initial state to the PLD 20_0 is not completed at Time T3, the transition to the PLD 20_0 is completed at the next rise of the signal gclk; thus, data setup for the flip-flops included in the PLD 20 during context switch can be prevented. Accordingly, abnormal-data setup for the flip-flops included in the PLD 20 can be prevented. Thus, data transfer between before and after context switch can be performed normally.

At Time T4, the potential of the signal contextin is set at an H level. The signal contextin can be controlled asynchronously with the signal clk. This means that the potential of the signal contextin does not need to be set at an H level at the time when the signal clk rises, for example.

At Time T5, the potential of the signal context[0] is set at an L level in synchronization with the rise of the signal clk. Then, at Time T6 when the signal clk falls, the potential of the signal context[1] becomes an H level. Thus, context switch starts, and the transition of the configuration of the PLD 20 from the PLD 20_0 to the PLD 20_1 starts.

At Time T7, the signal clk rises, but the potential of the signal gclk remains at an L level because the clock generator 13 illustrated in FIG. 2A performs clock gating for one clock. Thus, data setup for the flip-flops included in the PLD 20 can be prevented until the next rise of the signal clk. Although the transition from the PLD 20_0 to the PLD 20_1 is not completed at Time T7, the transition to the PLD 20_1 is completed at the next rise of the signal gclk; thus, data setup for the flip-flops included in the PLD 20 during context switch can be prevented. Accordingly, abnormal-data setup for the flip-flops included in the PLD 20 can be prevented. Thus, data transfer between before and after context switch can be performed normally.

Note that in the case where the potential of the signal mout is at an L level from Time T0 to Time T7, the clock generator 13 illustrated in FIG. 2A does not perform clock gating at Time T3 and Time T7; thus, the potential of the signal gclk becomes equal to the potential of the signal clk. Except for the above, the operation of the semiconductor device of one embodiment of the present invention is the same as that when the potential of the signal mout is at an H level.

Next, the operation of the semiconductor device having the configuration illustrated in FIG. 2B is described using the timing chart in FIG. 13B. Before Time T0, the configuration memories 12[0] to 12[m−1] perform configuration operation, and the potential of the signal config is at an H level. Furthermore, the potentials of the signal resetb, the signal contextin, the signal context[0], and the signal context [1] are at an L level. In addition, the potentials of the signals mout[0] to mout[m−1] are all at an L level.

At Time T0, the configuration memories 12[0] to 12[m−1] terminate configuration operation, and the potential of the signal config is set at an L level in synchronization with the rise of the signal clk. After that, the potentials of the signals mout[0] to mout[m−1] become potentials corresponding to configuration data retained in the memory cells 91[0] included in the configuration memories 12[0] to 12[m−1]. Here, the potential of the signal mout[1] is at an H level and the potentials of the other signals mout are all at an L level.

Note that when the signal mout[0] is the LSB and the signal mout[m−1] is the MSB, the case where the potentials of the signals mout[0] to mout[m−1] are all at an L level is "0" in decimal form. Furthermore, the case where the potential of the signal mout[1] is at an H level and the potentials of the other signals mout are all at an L level is "2" in decimal form. In FIG. 13B, the case where the potentials of the signals mout[0] to mout[m−1] are all at an L level is shown as "0" and the case where the potential of the signal mout[1] is at an H level and the potentials of the other signals mout are all at an L level is shown as "2."

At Time T1, the potential of the signal resetb is set at an H level in synchronization with the rise of the signal clk. Thus, reset states of the flip-flops of the circuits included in the semiconductor device of one embodiment of the present invention are canceled.

At Time T2, the potential of the signal context[0] is set at an H level in synchronization with the fall of the signal clk. Thus, context switch starts, and the transition of the configuration of the PLD 20 from the initial state to the PLD 20_0 starts.

At Time T3, the signal clk rises, but the potential of the signal gclk remains at an L level because the clock generator 13 illustrated in FIG. 2B performs clock gating for two clocks. Thus, data setup for the flip-flops included in the PLD 20 can be prevented until the signal clk two clocks after the signal clk rises at Time T3. Although the transition from the initial state to the PLD 20_0 is not completed at Time T3, the transition to the PLD 20_0 is completed at the rise of the signal gclk that occurs after clock gating; thus, data setup for the flip-flops included in the PLD 20 during context switch can be prevented. Accordingly, abnormal-data setup for the flip-flops included in the PLD 20 can be prevented. Thus, data transfer between before and after context switch can be performed normally.

At Time T4, the potential of the signal contextin is set at an H level. The signal contextin can be controlled asynchronously with the signal clk. This means that the potential of the signal contextin does not need to be set at an H level at the time when the signal clk rises, for example.

At Time T5, the potential of the signal context[0] is set at an L level in synchronization with the rise of the signal clk. Then, at Time T6 when the signal clk falls, the potential of the signal context[1] becomes an H level. Thus, context switch starts, and the transition of the configuration of the PLD 20 from the PLD 20_0 to the PLD 20_1 starts.

At Time T7, the signal clk rises, but the potential of the signal gclk remains at an L level because the clock generator 13 illustrated in FIG. 2B performs clock gating for two clocks. Thus, data setup for the flip-flops included in the PLD 20 can be prevented until the signal clk two clocks after the signal clk rises at Time T7. Although the transition from the PLD 20_0 to the PLD 20_1 is not completed at Time T7, the transition to the PLD 20_1 is completed at the rise of the signal gclk that occurs after clock gating; thus, data setup for the flip-flops included in the PLD 20 during context switch can be prevented. Accordingly, abnormal-data setup for the flip-flops included in the PLD 20 can be prevented. Thus, data transfer between before and after context switch can be performed normally.

As described above, in the semiconductor device of one embodiment of the present invention, data transfer between before and after context switch can be performed normally even at a high clock frequency. Thus, the semiconductor device of one embodiment of the present invention can operate at high speed. Furthermore, data setup for the flip-flops included in the PLD 20 during context switch can be prevented in the semiconductor device of one embodiment of the present invention; thus, generation of shoot-through current in the flip-flops can be suppressed. Accordingly, the power consumption of the semiconductor device of one embodiment of the present invention can be reduced. In addition, abnormal-data setup for the flip-flops included in the PLD 20 can be prevented, leading to an increase in the reliability of the semiconductor device of one embodiment of the present invention.

In the case of the configuration including a plurality of the configuration memories 12 as illustrated in FIG. 2B, for example, clock gating can be performed on the PLD 20 for two or more clocks. In that case, a clock frequency can be high as compared with the case of one configuration memory 12; thus, the semiconductor device of one embodiment of the present invention can operate at high speed. The greater the number of the configuration memories 12 is, the greater the number of clocks during which clock gating can be performed on the PLD 20 is; accordingly, a clock frequency can be increased, leading to high operation speed of the semiconductor device of one embodiment of the present invention.

Note that the operations shown in FIGS. 13A and 13B are only examples, and any operation can be performed as long as one embodiment of the present invention can be achieved. For example, the operation performed in synchronization with the rise of the signal clk or the signal gclk in FIGS. 13A and 13B can be performed in synchronization with the fall of the signal clk or the signal gclk. Furthermore, for example, the operation performed in synchronization with the fall of the signal clk or the signal gclk in FIGS. 13A and 13B can be performed in synchronization with the rise of the signal clk or the signal gclk.

This embodiment can be implemented in appropriate combination with any of the structures described in the other embodiments.

Embodiment 2

In this embodiment, an electronic component, an imaging device, an electronic device including an electronic component, and the like will be described as examples of semiconductor devices.

Figure 14A:
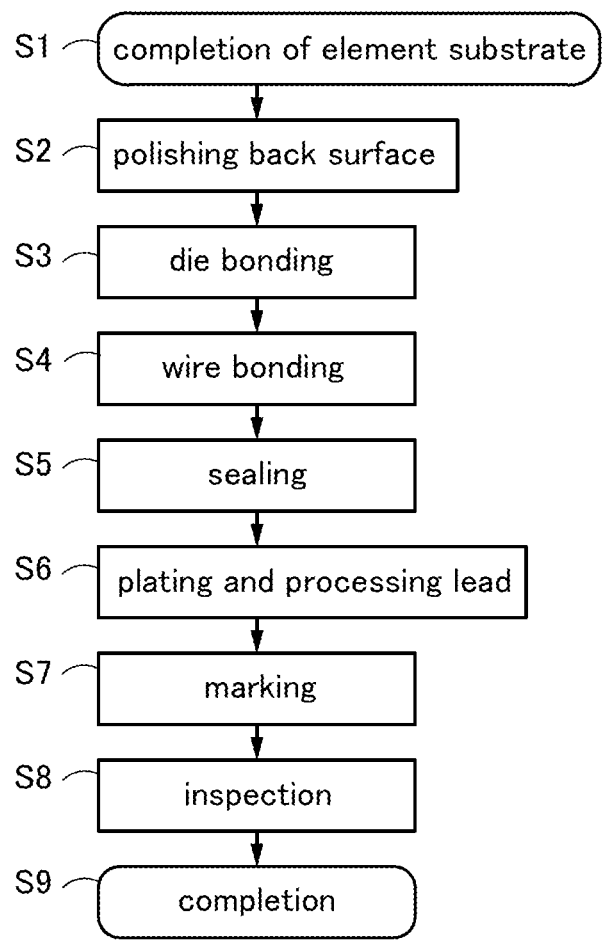
FIG. 14A is a flow chart showing an example of a method for manufacturing an electronic component and FIG. 14B is a schematic perspective view illustrating a configuration example of the electronic component.

FIG. 14A is a flow chart showing an example of a method for manufacturing an electronic component. An electronic component is also referred to as a semiconductor package, an IC package, or a package. For the electronic component, there are various standards and names corresponding to the direction or the shape of terminals; hence, one example of the electronic component will be described in this embodiment.

A semiconductor device including a transistor is completed by integrating detachable components on a printed circuit board through the assembly process (post-process). The post-process can be completed through steps shown in FIG. 14A. Specifically, after an element substrate is completed in a wafer process (S1), a dicing step for dividing the substrate into a plurality of chips is performed (S2). Before the substrate is divided into a plurality of pieces, the substrate is thinned to reduce warpage or the like of the substrate caused in the wafer process and to reduce the size of the component.

The chip is picked up to be mounted on and bonded to a lead frame in a die bonding step (S3). In the die bonding step, the chip may be bonded to the lead frame with a resin or a tape. As the bonding method, a method suitable for the product can be selected. In the die bonding step, the chip may be mounted on an interposer to be bonded. In a wire bonding step (S4), a lead of the lead frame is electrically connected to an electrode on the chip with a metal fine line (wire). A silver line or a gold line can be used as the metal fine line. Either ball bonding or wedge bonding can be used as wire bonding.

A wire-bonded chip is subjected to a molding step of sealing the chip with an epoxy resin or the like (S5). The lead of the lead frame is plated. Then, the lead is cut and processed into a predetermined shape (S6). This plate processing prevents rust of the lead and facilitates soldering at the time of mounting the chip on a printed circuit board in a later step. Printing process (marking) is performed on a surface of the package (S7). Through an inspection step (S8), the electronic component is completed (S9). Integrating the foregoing semiconductor device achieves a small electronic component with low power consumption.

Figure 14B:
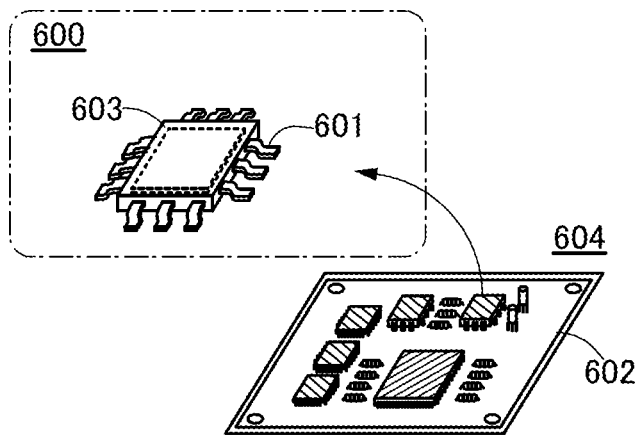

FIG. 14B is a schematic perspective view of an electronic component. FIG. 14B illustrates a quad flat package (QFP) as an example. An electronic component 600 illustrated in FIG. 14B includes a lead 601 and a circuit portion 603. In the circuit portion 603, the semiconductor device of one embodiment of the present invention is fabricated. The electronic component 600 is mounted on a printed circuit board 602, for example. A combination of a plurality of the electronic components 600 electrically connected to each other over the printed circuit board 602 can be equipped in an electronic device. A completed circuit board 604 is provided in a variety of electronic devices or the like.

The electronic component of this embodiment can be used for electronic devices in a wide variety of fields, such as digital signal processing, software-defined radio systems, avionic systems (electronic devices used in aircraft, e.g., communication systems, navigation systems, autopilot systems, and flight management systems), application specific integrated circuit (ASIC) prototyping, medical image processing, voice recognition, encryption, bioinformatics, emulators for mechanical systems, and radio telescopes in radio astronomy. According to this embodiment, it is possible to reduce the size and power consumption of an electronic device.

Examples of electronic devices include display devices, personal computers, and image reproducing devices provided with recording media (devices that read image data of recording media such as digital versatile discs (DVDs) and have displays for displaying images). Other examples are portable phones, game machines including portable game machines, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, and multifunction printers. FIGS. 15A to 15F illustrate specific examples of these electronic devices.

Figure 15A:
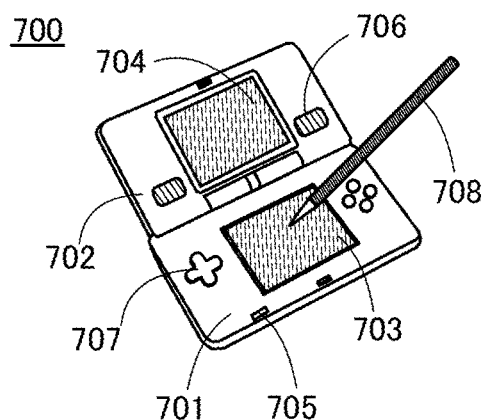
FIGS. 15A to 15F illustrate electronic devices.

A portable game machine 700 illustrated in FIG. 15A includes a housing 701, a housing 702, a display portion 703, a display portion 704, a microphone 705, a speaker 706, an operation key 707, a stylus 708, and the like.

Figure 15B:
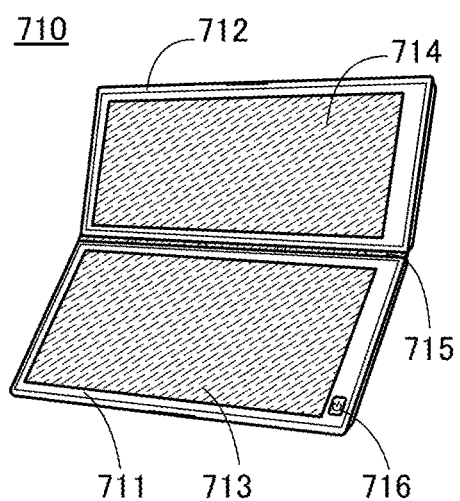

A portable information terminal 710 illustrated in FIG. 15B includes a housing 711, a housing 712, a display portion 713, a display portion 714, a joint 715, an operation key 716, and the like. The display portion 713 is provided in the housing 711, and the display portion 714 is provided in the housing 712. The housings 711 and 712 are connected to each other with the joint 715, and an angle between the housings 711 and 712 can be changed with the joint 715. Accordingly, the change in the direction of an image displayed on the display portion 713 or switch between display and non-display of an image may be performed by changing the angle between the housings 711 and 712 connected with the joint 715. A display device with a touch panel may be used as the display portion 713 and/or the display portion 714.

Figure 15C:
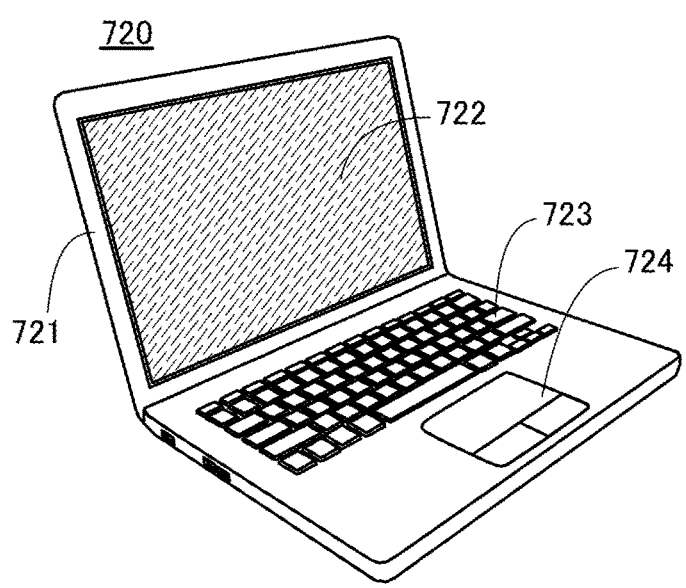

A personal computer 720 illustrated in FIG. 15C includes a housing 721, a display portion 722, a keyboard 723, a pointing device 724, and the like.

Figure 15D:
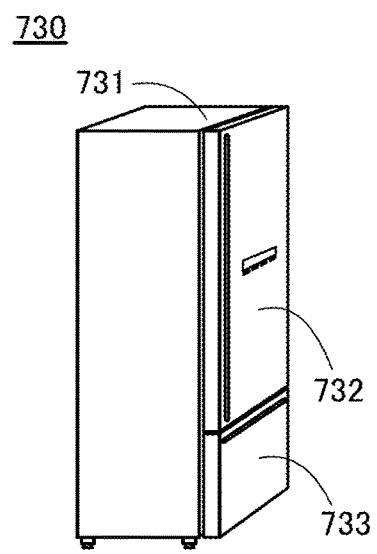

FIG. 15D illustrates an electric refrigerator-freezer as an example of a household appliance. An electric refrigerator-freezer 730 includes a housing 731, a refrigerator door 732, a freezer door 733, and the like.

Figure 15E:
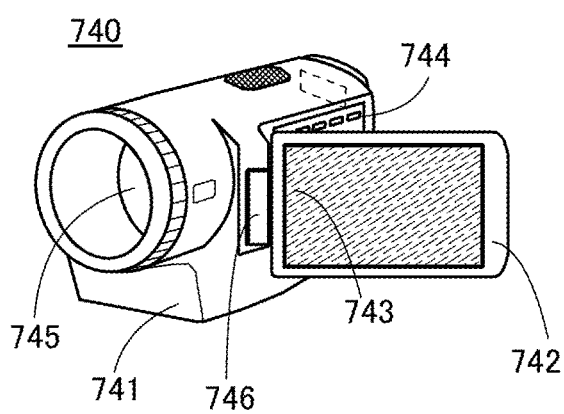

A video camera 740 in FIG. 15E includes a housing 741, a housing 742, a display portion 743, an operation key 744, a lens 745, a joint 746, and the like. The operation key 744 and the lens 745 are provided in the housing 741, and the display portion 743 is provided in the housing 742. The housing 741 and the housing 742 are connected to each other with the joint 746, and an angle between the housing 741 and the housing 742 can be changed with the joint 746. The change in the direction of an image displayed on the display portion 743 or switching between display and non-display of an image may be performed by changing the angle between the housings 741 and 742.

Figure 15F:
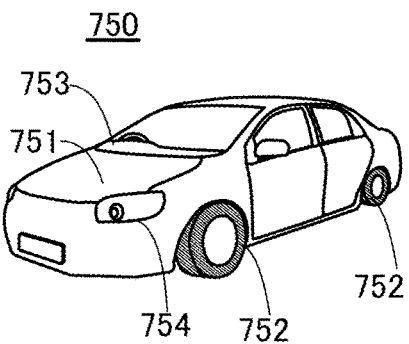

A motor vehicle 750 illustrated in FIG. 15F includes a car body 751, wheels 752, a dashboard 753, lights 754, and the like. The motor vehicle 750 may be engine-powered, or may be an electric vehicle or a hybrid vehicle.

Note that one embodiment of the present invention is not limited to the above electronic devices as long as the semiconductor device of one embodiment of the present invention is included.

This embodiment can be combined with any of the other embodiments described in this specification as appropriate.

EXPLANATION OF REFERENCE

10: controller, 11: context generator, 12: configuration memory, 13: clock generator, 20: PLD, 21: PLE, 31: inverter, 32: inverter, 33: inverter, 34: inverter, 35: inverter, 41: flip-flop, 42: flip-flop, 43: flip-flop, 51: AND circuit, 52: AND circuit, 53: AND circuit, 54: AND circuit, 55: XOR circuit, 56: NAND circuit, 57: AND circuit, 60: clock gating control circuit, 61: counter circuit, 62: comparator, 71: circuit, 72: circuit, 73: circuit, 74: circuit, 76: circuit, 77: circuit, 80: look-up table, 81: configuration memory, 83: flip-flop, 84: multiplexer, 91: memory cell, 92: transistor, 93: transistor, 94: wiring, 95: transistor, 95A: transistor, 95B: transistor, 96: latch circuit, 97: transistor, 98: latch circuit, 99: MRAM, 100: wiring, 101: transistor, 102A: capacitor, 102B: capacitor, 103A: wiring, 103B: wiring, 104A: transistor, 104B: transistor, 105A: wiring, 105B: wiring, 110: input/output circuit, 120: PSE, 131: column driver, 132: row driver, 600: electronic component, 601: lead, 602: printed circuit board, 603: circuit portion, 604: circuit board, 700:

portable game machine, 701: housing, 702: housing, 703: display portion, 704: display portion, 705: microphone, 706: speaker, 707: operation key, 708: stylus, 710: portable information terminal, 711: housing, 712: housing, 713: display portion, 714: display portion, 715: joint, 716: operation key, 720: personal computer, 721: housing, 722: display portion, 723: keyboard, 724: pointing device, 730: electric refrigerator-freezer, 731: housing, 732: refrigerator door, 733: freezer door, 740: video camera, 741: housing, 742: housing, 743: display portion, 744: operation key, 745: lens, 746: joint, 750: motor vehicle, 751: car body, 752: wheel, 753: dashboard, and 754: light.

This application is based on Japanese Patent Application serial no. 2015-222635 filed with Japan Patent Office on Nov. 13, 2015, the entire contents of which are hereby incorporated by reference.

The invention claimed is:

1. A semiconductor device comprising:
a configuration memory;
a first circuit;
a second circuit; and
a third circuit,
wherein the configuration memory is configured to retain configuration data,
wherein the configuration memory is configured to generate a first signal corresponding to the configuration data,
wherein a second signal is input to the first circuit and the second circuit,
wherein the first circuit is configured to generate a third signal and a fourth signal and output the third signal and the fourth signal to the configuration memory and the third circuit,
wherein the second circuit is configured to operate in a first mode or a second mode in accordance with the first signal,
wherein the second circuit is configured to output a fifth signal to the third circuit in the first mode and stop outputting the fifth signal to the third circuit in the second mode,
wherein the third circuit serves as a programmable logic circuit,
wherein the second signal serves as a clock signal that determines operation timing of the first circuit and the second circuit,
wherein the third signal and the fourth signal serve as signals for context switch, and
wherein the fifth signal serves as a clock signal that determines operation timing of the third circuit.

2. The semiconductor device according to claim 1,
wherein the second circuit is configured to perform switching from the first mode to the second mode after one of a potential of the third signal and a potential of the fourth signal starts to be changed from a low potential to a high potential, and
wherein the second circuit is configured to perform switching from the second mode to the first mode after outputting of the fifth signal is stopped for one clock.

3. An electronic component comprising:
the semiconductor device according to claim 1; and
a lead electrically connected to the semiconductor device.

4. An electronic device comprising:
the electronic component according to claim 3; and
one of a display device, a touch panel, a microphone, a speaker, an operation key, and a housing.

5. A semiconductor device comprising:
first to m-th configuration memories, where m is an integer of 2 or more;
a first circuit;
a second circuit; and
a third circuit,
wherein the first to m-th configuration memories are each configured to retain configuration data,
wherein the first to m-th configuration memories are configured to generate first to m-th digital signals each corresponding to the configuration data retained in a corresponding configuration memory,
wherein a first signal is input to the first circuit and the second circuit,
wherein the first circuit is configured to generate a second signal and a third signal and output the second signal and the third signal to the first to m-th configuration memories and the third circuit,
wherein the second circuit is configured to operate in a first mode or a second mode in accordance with the first to m-th digital signals,
wherein the second circuit is configured to output a fourth signal to the third circuit in the first mode and stop outputting the fourth signal to the third circuit in the second mode,
wherein the third circuit serves as a programmable logic circuit,
wherein the first signal serves as a clock signal that determines operation timing of the first circuit and the second circuit,
wherein the second signal and the third signal serve as signals for context switch, and
wherein the fourth signal serves as a clock signal that determines operation timing of the third circuit.

6. The semiconductor device according to claim 5,
wherein the second circuit is configured to generate binary integer data from the first to m-th digital signals in the second mode,
wherein the second circuit is configured to perform switching from the first mode to the second mode after one of a potential of the second signal and a potential of the third signal starts to be changed from a low potential to a high potential, and
wherein the second circuit is configured to perform switching from the second mode to the first mode after outputting of the fourth signal is stopped for clocks whose number is the integer.

7. The semiconductor device according to claim 5,
wherein the second circuit is configured to perform switching to the second mode when a potential of one of the first to m-th digital signals becomes a high potential.

8. An electronic component comprising:
the semiconductor device according to claim 5; and
a lead electrically connected to the semiconductor device.

9. An electronic device comprising:
the electronic component according to claim 8; and
one of a display device, a touch panel, a microphone, a speaker, an operation key, and a housing.

10. A semiconductor device comprising:
a clock generator;
a programmable logic device;
a configuration memory configured to output a first signal corresponding to configuration data to the clock generator; and
a context generator configured to output a context signal to the programmable logic device and the configuration memory, wherein the clock generator is configured to stop at least one clock of a clock signal output to the programmable logic device in accordance with the first signal.

11. The semiconductor device according to claim 10, wherein the clock generator is configured to stop that at least one clock of the clock signal during reconfiguration of the programmable logic device.

12. An electronic component comprising:
the semiconductor device according to claim 10; and
a lead electrically connected to the semiconductor device.

13. An electronic device comprising:
the electronic component according to claim 12; and
one of a display device, a touch panel, a microphone, a speaker, an operation key, and a housing.

14. A semiconductor device comprising:
a clock generator;
a programmable logic device;
a configuration memory configured to output a first signal corresponding to configuration data to the clock generator; and
a context generator configured to output a context signal to the programmable logic device and the configuration memory,
wherein the clock generator is configured to output a clock signal to the programmable logic device during a first period and configured to output a low potential to the programmable logic device for at least one clock during a second period in accordance with the first signal.

15. The semiconductor device according to claim 14, wherein reconfiguration of the programmable logic device is performed during the second period.

16. An electronic component comprising:
the semiconductor device according to claim 14; and
a lead electrically connected to the semiconductor device.

17. An electronic device comprising:
the electronic component according to claim 16; and
one of a display device, a touch panel, a microphone, a speaker, an operation key, and a housing.

* * * * *